(12) United States Patent
Tobita

(10) Patent No.: US 7,365,591 B2
(45) Date of Patent: Apr. 29, 2008

(54) VOLTAGE GENERATING CIRCUIT

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/253,733

(22) Filed: Oct. 20, 2005

(65) Prior Publication Data

US 2006/0028266 A1 Feb. 9, 2006

Related U.S. Application Data

(62) Division of application No. 10/822,826, filed on Apr. 13, 2004, now abandoned.

(30) Foreign Application Priority Data

May 19, 2003 (JP) ............................. 2003-140079
Dec. 17, 2003 (JP) ............................. 2003-419716

(51) Int. Cl.
*G05F 1/10* (2006.01)
*G05F 3/02* (2006.01)

(52) U.S. Cl. ..................................... 327/536

(58) Field of Classification Search ................ 327/536; 363/59–60
See application file for complete search history.

(56) References Cited

U.S. PATENT DOCUMENTS 6,130,572 A * 10/2000 Ghilardelli et al. ......... 327/536
6,198,342 B1 * 3/2001 Kawai ........................ 327/536
6,642,773 B2 * 11/2003 Lin et al. .................... 327/536
2002/0122324 A1 9/2002 Kim et al. ..................... 363/59

FOREIGN PATENT DOCUMENTS

DE 196 01 369 C1 4/1997
JP 4-372792 12/1992

OTHER PUBLICATIONS

Yoshinobu Nakagome, et al., "An Experimental 1.5-V 64-Mb DRAM", IEEE Journal of Solid-State Circuits, vol. 26, No. 4, Apr. 1991, pp. 465-472.
Dragan Maksimovic, et al., "Switched-Capacitor DC-DC Converters for Low-Power On-Chip Applications", Power Electronics Specialists Conference PESC 1999, 30th Annual IEEE, vol. 1, Jun. 27, 1999, pp. 54-59.

* cited by examiner

*Primary Examiner*—Quan Tra
(74) *Attorney, Agent, or Firm*—Oblon, Spivak, McClelland, Maier & Neustadt, P.C.

(57) ABSTRACT

A first transistor is arranged between a reference voltage node and a first node, and is connected at its gate to a second node. A second transistor is arranged between the second node and the reference voltage node, and is connected at its gate to the first node. Charges are supplied to the first and second nodes via capacitance elements receiving first and second control signals, respectively. Further, a third transistor is arranged between the second node and an output node, and is connected at its gate node to a third control signal φCT via a third capacitance element. A fourth transistor is connected between the output node and a gate node of the third transistor, and is connected at its gate to the second node. An internal voltage at an intended level can be generated with low power consumption while efficiently using charges without causing an ineffective current flow.

7 Claims, 20 Drawing Sheets

VOLTAGE GENERATING CIRCUIT

CROSS REFERENCE TO RELATED APPLICATIONS

This application is a divisional of and claims priority under 35 U.S.C. §120 to co-pending U.S. application Ser. No. 10/822,826, filed Apr. 13, 2004, and is based upon and claims the benefit of priority under 35 U.S.C. §119 from the prior Japanese Patent Application No. 2003-140079, filed on May 19, 2003, and Japanese Patent Application No. 2003-419716, filed on Dec. 17, 2003, the entire contents of each of which are incorporated herein by reference.

BACKGROUND OF THE INVENTION

1. Field of the Invention

The present invention relates to a voltage generating circuit for generating an internal voltage at a desired voltage level, and particularly to a structure of a voltage generating circuit efficiently generating an internal voltage by utilizing a charge pump operation of a capacitance element.

2. Description of the Background Art

Semiconductor device are configured to use internal voltages at various voltage levels in many cases. For example, in a DRAM (Dynamic Random Access Memory), a negative voltage is used for biasing a substrate region of a memory cell array at a constant voltage, and a high positive voltage higher than a power supply voltage is supplied to a selected word line. In a nonvolatile memory, negative and positive voltages are used for rewriting data.

When externally supplying such voltages at levels different from a power supply voltage level, a system scale increases, and power consumption of a whole system increases. In addition, a semiconductor device is required of pin terminals dedicated to reception of such voltages, and also increases the size.

In view of the above, semiconductor devices are generally configured to generate internally the voltages at required levels. An example of the circuit generating such an internal voltage is disclosed in Reference 1 (Japanese Patent Laying-Open No. 4-372792).

An internal voltage generating circuit disclosed in Reference 1 generates a negative voltage by utilizing a charge pump operation of a capacitance element. According to the structure of the internal voltage generating circuit of Reference 1, electric charges are accumulated in a charge-accumulation node through charge pump operation of a charging capacitance element. A discharge control transistor is turned on through capacitance coupling of a controlling capacitance element to discharge the charge-accumulation node to a ground voltage level. Thereafter, the charging capacitance element performs the charge pump operation to pull out the charges from the charge-accumulation node, to drive that node to a negative voltage level. The charge-accumulation node is changed with an amplitude of the power supply voltage. Negative charges of this charge-accumulation node are supplied to an output node through an output transistor so that a negative voltage at a level of −VCC is supplied, where VCC represents the power supply voltage.

A gate potential of the output transistor changes between a ground voltage GND and a negative voltage −VCC under control of an output control transistor having a gate connected to the charge-accumulation node.

Reference 1 intends to generate a negative voltage at an adequate voltage level even under a low power supply voltage by changing the charge-accumulation node with an amplitude of VCC.

In the structure generating an internal voltage by utilizing the charge pump operation of the capacitance element, it is required, in view of power consumption of the semiconductor device, to transmit efficiently the charges produced through the charge pump operation to the output node for generation of the internal voltage.

In Reference 1, in order to change the voltage level of the charge-accumulation node with an amplitude of −VCC, the charge-accumulation node is precharged to the ground voltage level by the discharge control transistor, and then is discharged to the voltage level of −Vcc through the charge pump operation of the charging capacitance element. For turning off the discharge control transistor in such operation, a second control transistor is provided to be made conductive to connect the charge-accumulation node to the gate of the discharge control transistor. The second control transistor is made conductive to connect electrically the gate of the discharging control transistor to the charge-accumulation node when the voltage on the charge-accumulation node lowers to or below −Vth, where Vth denotes a threshold voltage of the second control transistor.

However, the capacitance element receiving a control signal is connected to the discharge control transistor for turning on it. Therefore, the gate potential of this discharge control transistor changes at a time constant, which is determined by an on-resistance of the second control transistor and a capacitance existing at the gate of the discharge control transistor. Therefore, a certain time is required until the discharge control transistor is turned off. Accordingly, the discharge control transistor maintains the on-state for a certain time period while the charge-accumulation node is at the voltage level of −VCC, and a current flows to the charge-accumulation node from the ground node. This impedes the operation of extracting the charges through the charge pump of the charging capacitance element, and an ineffective current is consumed.

In an operation of precharging the charge-accumulation node to the ground voltage level, if the output transistor is not made non-conductive, precharged charges are supplied to the output node at a negative level through the output transistor so that the voltage level of the negative potential rises. For the on/off control of this output transistor, an output control transistor having substantially the same structure as that for on/off control of the discharge control transistor is employed. Accordingly, in precharging of the charge-accumulation node to the ground voltage level, the output transistor likewise is made conductive for a certain time period so that a current is wasted.

In the structure of Reference 1, as described above, the charges produced through the charge pump operation of the capacitance element are wasted, and it is difficult to generate efficiently the voltage at a desired level with low power consumption.

SUMMARY OF THE INVENTION

An object of the invention is to provide a voltage generating circuit, which can efficiently utilizes the charges, to generate a voltage at an intended level.

According to a first aspect of the invention, a voltage generating circuit includes a first transistor of a first conductivity type connected between a reference voltage node supplied with a predetermined voltage and a first internal node, and having a control electrode connected to a second internal node; a second transistor of the first conductivity type connected between the reference voltage node and the second internal node, and having a control electrode connected to the first internal node; a first capacitance element connected between a first input node receiving a first control signal for precharging and the first internal node; a second capacitance element connected between a second input node receiving a second control signal for charge accumulation and the second internal node; a third transistor of a second conductivity type connected between the second internal node and an output node, and having a control electrode connected to a third internal node; a third capacitance element connected between the third internal node and a third input node receiving a third control signal for charge transfer; and a fourth transistor of the second conductivity type connected between the output node and the third internal node, and having a control electrode connected to the second internal node.

According to another aspect of the invention, a voltage generating circuit includes a first transistor connected between a precharge voltage supply node supplying a precharge voltage and a first internal node, and having a control electrode connected to a second internal node; a first capacitance element connected between a first input node receiving a first control signal for precharging and a second internal node; a second transistor connected between the first and second internal nodes, and having a control electrode connected to a second input node receiving a second control signal for charge accumulation; a third transistor connected between the first internal node and an output node, and having a control electrode connected to a third internal node; a fourth transistor connected between the output node and the third internal node, and having a control electrode connected to the first internal node; a second capacitance element connected between a third input node receiving a third control signal for second charge precharging and the first internal node; and a third capacitance element connected between a fourth input node receiving a fourth control signal for charge transfer and the third internal node.

In the voltage generating circuit according to the first aspect, through cross-coupling of the first and second transistors, and the first and second transistors can be turned on/off at optimal timing to change the voltages at the first and second internal nodes at high speed, to held at the changed voltage levels. Therefore, the second transistor is made off during the change in voltage on the second internal node serving as the charge-accumulation node, and then the charge pump operation is effected on the second internal node, so that unnecessary current can be prevented from flowing into the second internal node.

According to the voltage generating circuit of the another aspect, the first internal node is precharged with the precharging voltage, and is coupled with the third control signal via the second capacitance element. Further, the first internal node is connected to the control electrode of the fourth transistor. Therefore, the on/off state of the respective transistors can be individually controlled by the charge pump operation through the capacitance elements, and flow of an ineffective current can be suppressed so that the charges can be efficiently used to produce the internal voltage at the intended level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
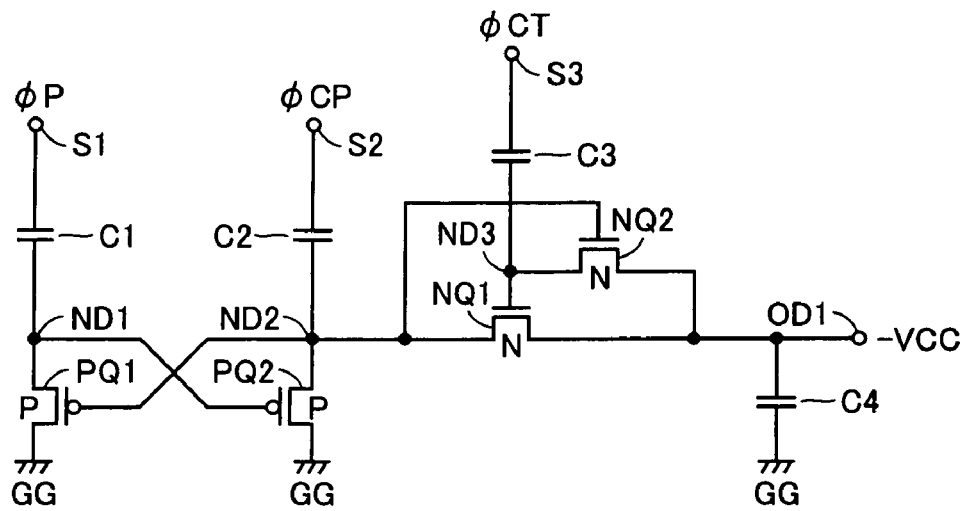
FIG. 1 shows a construction of a voltage generating circuit according to a first embodiment of the invention.

FIG. 1 shows a structure of a voltage generating circuit according to a first embodiment of the invention. The voltage generating circuit shown in FIG. 1 generates a negative voltage lower than a reference potential. In this embodiment, a ground potential GND is used as the reference potential, and a signal for controlling a charge pump operation changes between a ground voltage and a power supply voltage VCC so that a negative voltage of –VCC is produced.

In FIG. 1, the voltage generating circuit includes a P-channel MOS transistor (insulated gate field-effect transistor) PQ1 connected between an internal node ND1 and a reference potential node (referred to as a "ground node" hereinafter) GC and having a gate connected to an internal node ND2, a P-channel MOS transistor PQ2 connected between internal node ND2 and ground node GG and having a gate connected to internal node ND1, a capacitance element C1 connected between a control signal input node S1 receiving a precharging control signal φP and internal node ND1, and a capacitance element C2 connected between a control signal input node S2 receiving a control signal φCP for charge accumulation and internal node ND2.

MOS transistors PQ1 and PQ2 correspond to the first and second transistors, respectively, and capacitance elements C1 and C2 correspond to the first and second capacitance elements, respectively. Control signals φP and φCP correspond to the first and second control signals, respectively. Internal nodes ND1 and ND2 correspond to the first and second internal nodes, respectively.

The voltage generating circuit further includes an N-channel MOS transistor NQ1 connected between internal node ND2 and an output node OD1 and having a gate connected to an internal node ND3, an N-channel MOS transistor NQ2 connected between internal node ND3 and output node OD1 and having a gate connected to internal node ND2, and a capacitance element C3 connected between a control signal input node S3 receiving a control signal φCT for charge transference and internal node ND3.

MOS transistors NQ1 and NQ2 correspond to the third and fourth transistors, respectively, capacitance element C3 corresponds to the third capacitance element, and control signal φCT corresponds to the third control signal.

A capacitance element C4 is connected between output node OD1 and the ground node. This capacitance element C4 serves to stabilize an output voltage of –VCC against variation of an output load, and may be eliminated if the variation in output load is small and therefore, the variation in output voltage of –VCC is small. A voltage on output node OD1 is applied to internal circuitry, not shown.

Each of control signals φP, φCP and φCT changes between ground voltage GND and power supply voltage VCC.

Figure 2:
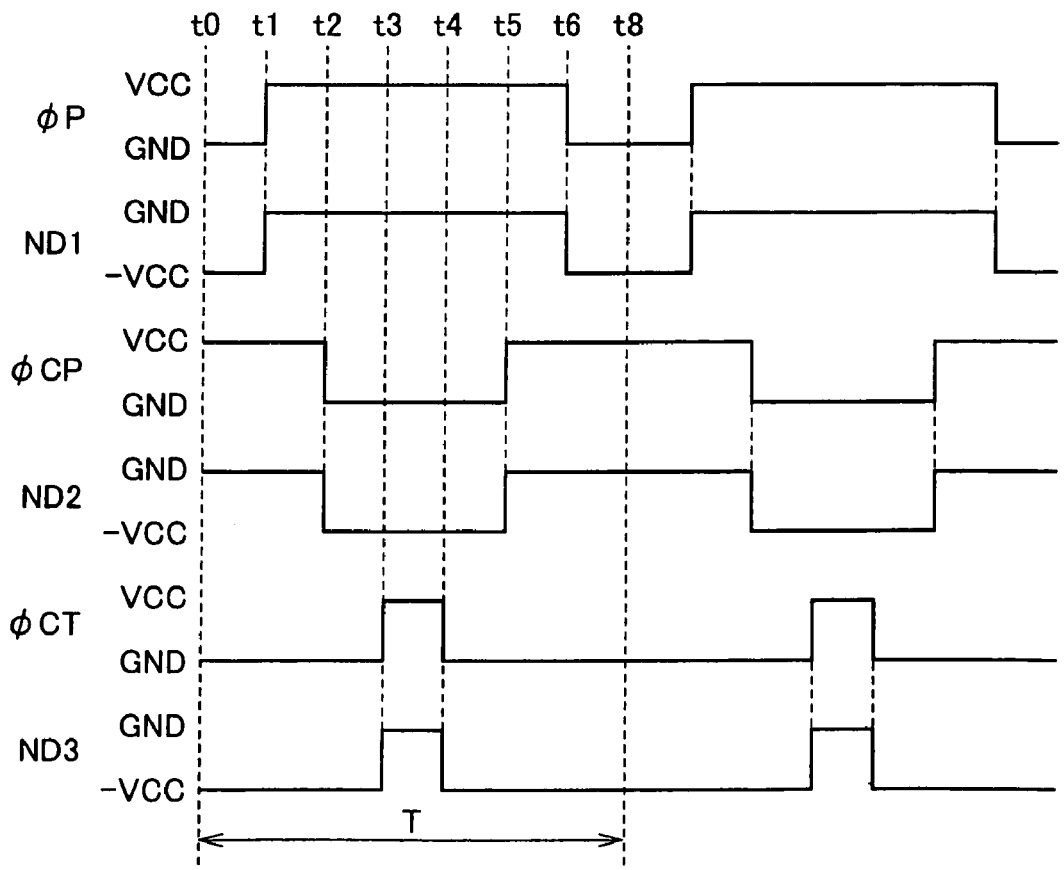
FIG. 2 is a signal waveform diagram illustrating an operation of the voltage generating circuit shown in FIG. 1.

FIG. 2 is a timing chart illustrating an operation of the voltage generating circuit shown in FIG. 1. For the sake of simplicity, FIG. 2 shows operation waveforms for the case when the voltage on output node OD1 is at the predetermined voltage level of –VCC. Referring to FIG. 2, an operation of the voltage generating circuit shown in FIG. 1 will now be described.

Control signals φP, φCP and φCT change at a cycle of T. FIG. 2 illustrates signal waveforms over a time period of 2·T.

At a time t0, control signals φP, φCP and φCT are at the levels of ground voltage GND, power supply voltage VCC and ground voltage GND, respectively. In this state, through a charge pulling-out operation of capacitance element C1, node ND1 is at the voltage level of –VCC, and through a charge supplying operation of the capacitance element C2, node ND2 is at the voltage level of ground voltage GND.

For P-channel MOS transistor PQ1, node ND1 serves as a drain node, and ground node GG serves as a source node. P-channel MOS transistor PQ1 is of an enhancement type, and has a threshold voltage of a predetermined magnitude. Therefore, P-channel MOS transistor PQ1 maintains the non-conductive state due to equal potentials at its gate and source, and no current flows between node ND1 and ground node GG.

MOS transistor PQ2 receives a negative potential –VCC at its gate, and equal potentials at its drain (node ND2) and source (ground node) so that no current flows between the drain and source of MOS transistor PQ2.

As for N-channel MOS transistor NQ1, node ND2 is at the level of ground voltage GND, output node OD1 is at the level of negative voltage –VCC and node ND3 is at the level of negative voltage –VCC. N-channel MOS transistor NQ1 is of an enhancement type, has a threshold voltage of a constant magnitude, and maintains the non-conductive state when the gate potential is equal to the source potential.

N-channel MOS transistor NQ2 has a gate potential at the level of the voltage on node ND2 or the level of ground voltage GND, and has the drain and source at the equal potential because node ND3 and output node OD1 are at equal potential levels. Thus, no current flows between the drain and source of MOS transistor NQ2. According to control signal φP, MOS transistor PQ2 is made conductive to precharge node ND2 to the ground voltage level. In an initial stage of the charge pumping operation, the precharge voltage level of node ND2 is lowered toward the ground voltage.

At a time t1, when control signal φP changes from the level of ground voltage GND to the level of power supply voltage VCC, the charge pumping by capacitance element C1 raises the voltage level of node ND1 from negative voltage –VCC to ground voltage GND. In the stable state, the drain and source of MOS transistor PQ1 are at the same voltage level, and no current flows through MOS transistor PQ1.

In a transition time period of an initial stage of the charge pumping operation, node ND1 is at the voltage level not lower than ground voltage GND, and node ND1 and the ground node serve as the source and drain of MOS transistor PQ1, respectively. However, the voltage level of node ND2 is high in this state. MOS transistor PQ1 is of the enhancement type, receives the gate to source voltage not higher than an absolute value of the threshold voltage, and maintains the non-conductive state. Thus, no current flows between the drain and the source of MOS transistor PQ1.

Since node ND2 is at the level of ground voltage GND, MOS transistor PQ2 has the drain and the source at equal potentials, and no current flows between the drain and source of MOS transistor PQ2 even when the voltage level of node ND1 rises from negative voltage –VCC to the ground voltage GND. By raising control signal φP, MOS transistor PQ2 is made non-conductive for preparing for the next charge pump operation on node ND2.

Node ND2 holds the level of ground voltage GND, and node ND3 is at the negative voltage level. In this state, MOS transistor NQ2 is conductive, and electrically connects output node OD1 to internal node ND3, so that internal node ND3 becomes equal in voltage level to output node OD1. Thereby, MOS transistor NQ1 reliably maintains the non-conductive state. When the voltage levels of internal node ND3 and output node OD1 become equal to each other, a current stops flowing through MOS transistor NQ2.

By equalizing the voltage levels on internal node ND3 and output node OD1, the gate to source voltage of MOS transistor NQ1 is maintained at or below the threshold voltage to prevent MOS transistor NQ1 of the enhancement type from turning on before transferring charges, even when internal node ND2 is driven to the negative voltage level and internal node ND2 serves as the source of MOS transistor NQ1. In an initial stage of the charge pumping operation, when internal node ND2 is driven to the negative voltage level, internal node ND3 is at a high voltage level, and MOS transistor NQ1 may be rendered conductive. In this case, however, negative charges are merely transferred to output node OD1 before generation of control signal φCT, and the charges are utilized for lowering the output voltage. Thus, the charges are effectively utilized.

At a time t2, control signal φCP lowers from the level of power supply voltage VCC to the level of ground voltage GND, and the charge pumping by capacitance element C2 lowers the voltage level of node ND2. Even when the voltage level of node ND2 changes from ground voltage GND to a negative voltage, both the drain and source of MOS transistor PQ1 is at the level of ground voltage GND, and no current flows between its drain and source.

Since MOS transistor PQ2 has node ND2 serving as the drain, the gate and source (ground node) are both at the level of ground voltage. MOS transistor PQ2 is of the enhancement type, and has the gate-source voltage smaller than the absolute value of its threshold voltage so that MOS transistor PQ2 maintains the non-conductive state. Accordingly, node ND2 lowers to the level of negative voltage −VCC through the charge pump operation of capacitance element C2. In this state, node ND3 is at the level of negative voltage −VCC, and MOS transistor NQ1 has output node OD1 serving as the source, has the gate and source at the equal potentials, and maintains the non-conductive state.

When node ND2 is driven to the negative voltage level, the voltage level of node ND2 becomes lower than the voltage level of output node OD1. The voltage level at node ND3 is the voltage level at the output node. When control signal φCT is at the ground voltage level, MOS transistor NQ1 is of the enhancement type, and has the gate-source voltage smaller than the threshold voltage during the transition and stable stages, and maintains the non-conductive state so that node ND2 can be accurately driven to the negative voltage level.

When node ND2 is driven to the negative voltage level in the transition time period, MOS transistor PQ1 is made conductive to lower the voltage level of node ND1 if the voltage level of node ND1 is higher than the ground voltage.

In the charge pump operation on node ND2, therefore, there is no path allowing flow of an ineffective current adversely affecting the voltage level of node ND2, and the charges can be efficiently utilized to set node ND2 to the level of negative voltage −VCC.

In MOS transistor NQ2, the drain and source are at the same level of negative voltage −VCC, so that no current flows between the drain and source.

At a time t3, control signal φCT rises from the level of ground voltage GND to the level of power supply voltage VCC. At this time, control signal φP is at the level of power supply voltage VCC, and control signal φCP is at the level of ground voltage GND. In this state, the charge pumping by capacitance element C3 raises the voltage level of node ND3 from negative voltage −VCC to the level of ground voltage GND. Since node ND2 is at the level of negative voltage −VCC, MOS transistor NQ1 is rendered conductive to couple node ND2 to output node OD1. If the voltage level of output node OD1 is higher than negative voltage −VCC, negative electric charges move from output node OD1 to node ND2, so that output node OD1 and node ND2 attain the equal voltage level. Specifically, in the stable state, output node OD1 is at the voltage level of −VCC. In this case, MOS transistor NQ2 has the gate and source at the equal potentials, and therefore maintains the non-conductive state so that no current flows between the drain and source of MOS transistor NQ2.

In a transition period such as a start of the charge pumping, MOS transistor NQ2 has internal node ND3 serving as the drain, has the gate in potential lower than the source upon start of charge transfer start, and maintains the non-conductive state. Even if the gate and source are made equal in potential to each other through charge transfer, MOS transistor NQ2 maintains the non-conductive state due to its threshold voltage, and does not adversely affect the charge transfer operation.

Thus, node ND3 is driven to the power supply voltage level in accordance with control signal φCT, and negative charges can be efficiently supplied to output node OD1 to produce negative voltage −VCC of the intended voltage level.

At a time t4, control signal φCT falls from the level of power supply voltage VCC to the level of ground voltage GND, and the voltage level of node ND3 lowers from ground voltage GND to negative voltage −VCC. The lowest possible potential of the source node (node ND2) of MOS transistor NQ1 is the negative voltage −VCC, and MOS transistor NQ1 is reliably made non-conductive.

MOS transistor NQ2 has the drain and source at the levels of negative voltage −VCC, and causes no current flow therethrough.

In the transition period at the start of the charge pumping, when nodes ND2 and OD1 are at the voltage levels higher than negative voltage −VCC, node ND3 merely returns to the voltage level of output node OD1 in the preceding cycle, and MOS transistor NQ2 has output node OD1 serving as the source, and has the gate and source equal in potential, and maintains the non-conductive state. Even when MOS transistor NQ1 is turned on, output node OD1 and internal node ND2, which serve as the source and drain of MOS transistor NQ1, respectively, are at the same voltage level, and no current flow through MOS transistor NQ1. In the transition period, the voltage level, to which node ND3 returns, is the voltage level at which MOS transistor NQ1 is set non-conductive, and no charge is wasted.

At a time t5, control signal φCP rises from the level of ground voltage GND to the level of power supply voltage VCC. In this period, control signal φP is at the level of power supply voltage VCC. Control signal φCT is at the level of ground voltage GND. In accordance with the rising of control signal φCP, through charge pumping operation by capacitance element C2, the voltage level of node ND2 rises from negative voltage −VCC to the ground voltage GND. In this operation, MOS transistor PQ1 has both the drain and source kept at the level of ground voltage GND, and turns non-conductive in accordance with the rising of its gate potential. Thus, no current flows through MOS transistor PQ1.

In MOS transistor PQ2, the voltage level of node ND2 merely rises from negative voltage −VCC to ground voltage GND, and does not exceed the ground voltage GND, so that the ground node serves as the source of MOS transistor PQ2, which in turn maintains the non-conductive state.

When node ND2 is raised in potential, node ND2 may be held at a voltage level higher than ground voltage GND (node ND2 serves as a source) in the transition period such as a start period of the charge pumping operation. In this case, control signal φP is lowered to render MOS transistor PQ2 conductive so that node ND2 is reliably discharged toward the ground voltage level. Therefore, a particular problem does not occur.

At time t5, even when the voltage level of node ND2 rises to the ground voltage level, node ND3 is at the level of negative voltage −VCC so that MOS transistor NQ1 maintains the non-conductive state. Even when MOS transistor NQ2 turns conductive, internal node ND3 is at the voltage level of output node OD1, i.e., the level of negative voltage −VCC so that MOS transistor NQ2 has the gate and the source at the equal voltages, and thus maintains the non-conductive state. Therefore, no current flows between the drain and source of MOS transistor NQ2.

At time t6, control signal φP falls to the level of ground voltage GND. Accordingly, capacitance element C1 lowers the voltage level of node ND1 from ground voltage GND to negative voltage −VCC. In accordance with this voltage lowering of node ND1, MOS transistor PQ2 turns conductive, and node ND2 is reliably set to the level of ground voltage GND.

Even in the case where node ND2 is driven to a high voltage level higher than ground voltage GND in the transition period, the voltage level of node ND2 can be reliably lowered. In the next cycle, the voltage level of node ND2 can be further lowered in accordance with control signal φCP, and the output voltage level can be lowered.

In the potential lowering of node ND2, MOS transistor PQ1 has the ground node serving as its source, and accordingly has the gate and the source at the same voltage level, so that MOS transistor PQ1 maintains the non-conductive state.

At time t8, a cycle T for one charge pump operation completes, and the operation stating at time to will be repeated.

In the voltage generating circuit shown in FIG. 1, therefore, an ineffective current does not flow during the charge pump operation, and the charges can be efficiently utilized to generate the internal voltage at an intended level.

MOS transistors PQ1 and PQ2 are cross-coupled, and the gate potentials thereof are individually set by the charge pump operations of the capacitance elements. After these MOS transistors PQ1 and PQ2 are made non-conductive, the voltage levels of nodes ND1 and ND2 can be reliably and rapidly changed in accordance with the control signals.

For the sake of simplicity, an effect of a parasitic capacitance at internal node ND2 is neglected in the above description. If internal node ND2 has a parasitic capacitance of an innegligible magnitude, the voltage amplitude on node ND2 is smaller than power supply voltage VCC and accordingly the output voltage of output node OD1 is made lowered in absolute value.

Control signal φCP determining the voltage amplitude of internal node ND2 is changed between power supply voltage VCC and ground voltage GND. However, with the reference voltage being a voltage Vr instead of ground voltage GND, and control signal φCP having a voltage amplitude Vφ, an output voltage VOUT of output node OD1 can be expressed by the following relation (1):

$$VOUT = Vr - V\phi \quad (1)$$

Generally, as in the above description of the operations, reference voltage Vr is equal to ground voltage GND or 0 V, and control signal φCP is produced from a circuit using power supply voltage VCC and ground voltage GND as operation power supply voltages. Therefore, assuming that voltage amplitude Vφ is equal to power supply voltage VCC, the above relation (1) can be modified into the following relation (2);

$$VOUT = -VCC \quad (2)$$

In the above description, all control signals φP, φCP and φCT change between power supply voltage VCC and ground voltage GND, and are the same voltage levels in the high level and in the low level. However, the high levels of these control signals φP, φCP and φCT may be different in voltage level from each other, and the low levels thereof may be different in voltage level from each other, provided that MOS transistors PQ1, PQ2, NQ1 and NQ2 are made non-conductive to prevent current flow in a direction reverse to that of voltage change upon the voltage change on internal nodes ND1, ND2 and ND3.

According to the first embodiment of the invention, as described above, the cross-coupled P-channel MOS transistors are used, and the gate node potentials thereof are determined by the charge pump operations of the capacitance elements. In addition, the conduction/non-conduction states of the output transistor are set by the control signal. Thus, it becomes possible to prevent flow of an unnecessary current upon change of the potential of the charge-accumulation node so that the voltage at an intended level can be efficiently produced.

Second Embodiment

Figure 3:
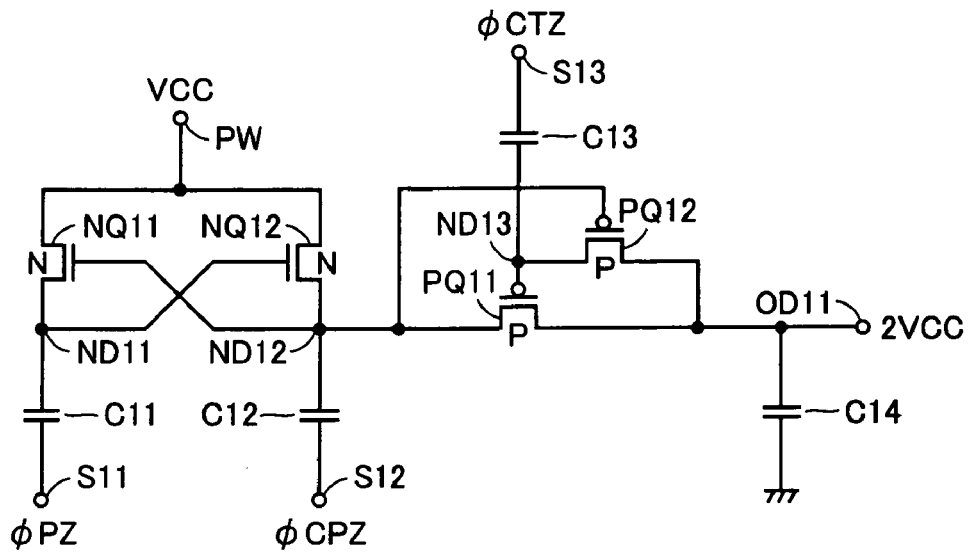
FIG. 3 shows a structure of a voltage generating circuit according to a second embodiment of the invention.

FIG. 3 shows a structure of a voltage generating circuit according to a second embodiment of the invention. The voltage generating circuit shown in FIG. 3 uses power supply voltage VCC as a reference voltage, and generates a high voltage of 2·VCC higher than power supply voltage VCC.

In FIG. 3, the voltage generating circuit includes an N-channel MOS transistor NQ11 connected between a power supply node (reference node) PW and an internal node (first internal node) ND11 and having a gate connected to an internal node (second internal node) ND12, an N-channel MOS transistor NQ12 connected between a power supply node PW and an internal node ND12 and having a gate connected to internal node ND11, a capacitance element (first capacitance element) C11 connected between a control signal input node (first control signal input node) S11 receiving a first control signal φPZ and internal node ND11, and a capacitance element (second capacitance element) C12 connected between a control signal input node (second control signal input node) S12 receiving a control signal φCPZ and internal node ND12.

Control signals φPZ and φCPZ each change between power supply voltage VCC and ground voltage GND.

The voltage generating circuit further includes a P-channel MOS transistor (third transistor) PQ11 connected between internal node ND12 and an output node OD11 and having a gate connected to an internal node (third internal node) ND13, a P-channel MOS transistor (fourth transistor) PQ12 connected between internal node ND13 and output node OD11 and having a gate connected to internal node ND12, and a capacitance element (third capacitance element) C13 connected between a control signal input node (third control signal internal node) S13 receiving a control signal φCTZ and internal node ND13.

In the above description, parenthesized components correspond to the elements in the claims. Control signal φCTZ changes between power supply voltage VCC and ground voltage GND.

Output node OD11 is provided with a stabilizing capacitance C14 for stabilizing a voltage on output node OD11. This stabilizing capacitance C14 may not be provided if variation in load on output node OD11 is small.

A voltage generating circuit shown in FIG. 3 is equivalent to the voltage generating circuit shown in FIG. 1, provided that the conductivity types of transistors are inverted, and the ground node and the power supply node are replaced with each other. Control signals φPZ, φCP and φCT are complementary to control signals φP, φCPZ and φCTZ shown in FIG. 1.

Figure 4:
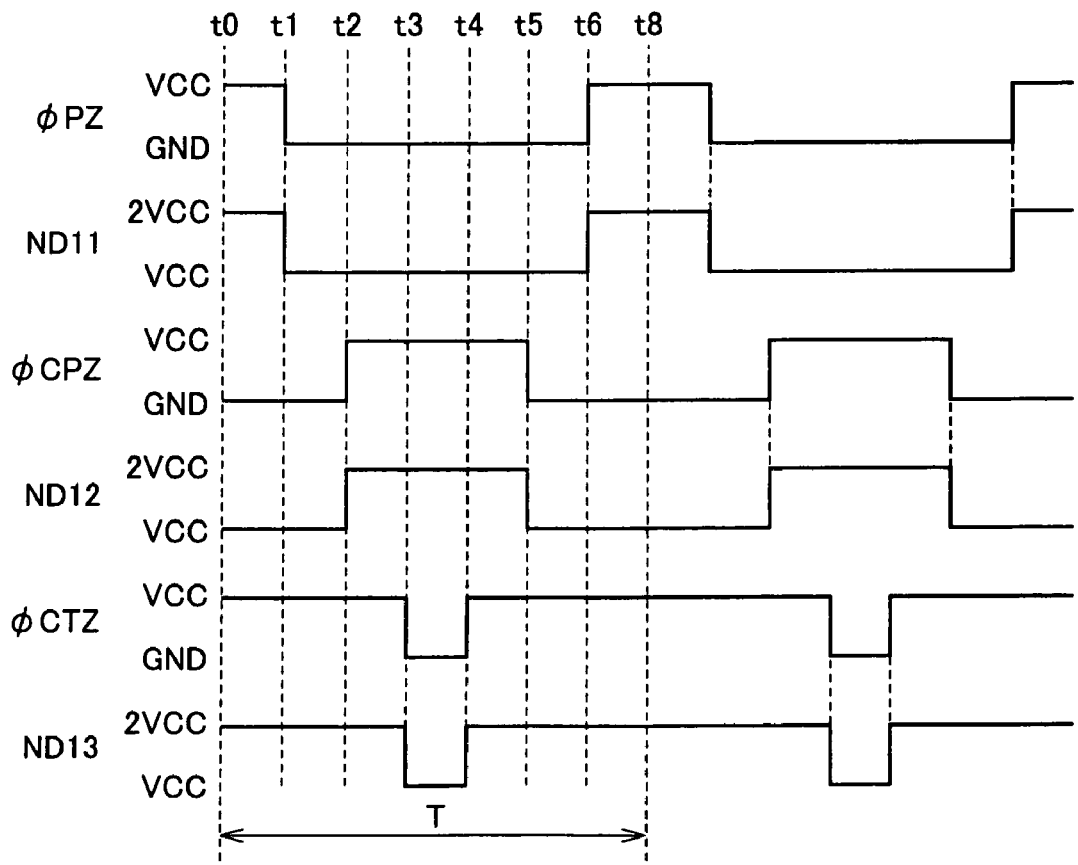
FIG. 4 is a signal waveform diagram illustrating an operation of the circuit shown in FIG. 3.

FIG. 4 is a signal waveform diagram illustrating an operation of the voltage generating circuit shown in FIG. 3. For the sake of simplicity, FIG. 4 also illustrates signal waveforms in the case when the output voltage is stable at the level of 2·VCC. Referring to FIG. 4, an operation of the voltage generating circuit shown in FIG. 3 will now be described.

In the voltage generating circuit shown in FIG. 3, the signal polarities as well as the conductivity types of transistors in the circuit generating negative voltage −VCC shown in FIG. 1 are inverted as described above. Therefore, similar operations are performed. Thus, flow of an ineffective current can be prevented.

At time t0, control signals φPZ, φCPZ and φCTZ are at the levels of power supply voltage VCC, ground voltage GND and power supply voltage VCC, respectively. In this state, node ND11 is at a high voltage level of 2·VCC, and node ND12 is at a level of power supply voltage VCC (in the stable state). MOS transistor NQ11 has a power supply node PW serving as a source, and has gate and source at the same voltage level, and is made non-conductive.

Even if MOS transistor NQ12 receives potential of high voltage of 2·VCC at a gate, the voltage levels of node ND12 and power supply node PW are equal to each other, so that no current flows between the drain and source of MOS transistor NQ12.

Node ND13 is at the level of high voltage of 2·VCC, and MOS transistor PQ11 has a gate not lower in potential than the source and drain, and maintains the non-conductive state. When the output voltage is stable, node ND12 is at the level of power supply voltage VCC, and therefore MOS transistor PQ12 is conductive. In addition, the voltage levels of node ND13 and output node OD11 are equal to each other, so that no current flows through MOS transistor PQ12.

In a transition period such as a start of the charge pumping operation, if the voltage of output node OD11 is lower than the level of final voltage of 2·VCC, when the voltage level of node ND12 is made lower than the voltage levels of node ND13 and output node OD11, MOS transistor PQ12 is turned on to connect electrically node ND13 to output node OD11. In this case, however, a current flows in the direction of raising the voltage level of output node OD11. Therefore, any ineffective current, which impedes rising of the voltage of output node OD11, does not flow. In this operation, the flow of current through MOS transistor PQ12 stops when the voltage levels of output node OD11 and node ND13 become equal to each other. In this state, since output node OD11 serves as the source of MOS transistor PQ11, MOS transistor PQ11 has the gate and source potentials made equal to each other, and maintains the non-conductive state.

At time t1, control signal φPZ falls from the level of power supply voltage VCC to the level of ground voltage GND. MOS transistor NQ11 turns non-conductive, and the charge pumping by capacitance element C11 lowers the voltage level of node ND11 from the high voltage of 2·VCC to power supply voltage VCC. In this state, node ND12 is at the level of power supply voltage VCC, and MOS transistor NQ12 is non-conductive. The potential of node ND12 causes no change, and no ineffective current flows in this state.

At time t2, control signal φCPZ rises from the level of ground voltage GND to the level of power supply voltage VCC, and the voltage level of node ND12 rises from power supply voltage VCC to the high voltage of 2·VCC. In this state, even when MOS transistor NQ11 turns conductive, the voltage levels of node ND11 and power supply node PW are equal to each other, and therefore no current flows. When internal node ND12 attains the level of high voltage of 2·VCC, MOS transistor PQ12 has the gate set at a potential not lower than the source and drain potentials, and is reliably set to the non-conductive state. MOS transistor PQ11 has the gate at the high voltage of 2·VCC. Even when the voltage level of node ND12 is boosted to the high voltage of 2·VCC, MOS transistor PQ11 has node ND12 serving as the source thereof, has the gate made equal in potential to the source, and therefore, maintains the non-conductive state.

In the transition state where the voltage of output node OD11 is lower than the final high voltage of 2·VCC, MOS transistor PQ12 turns non-conductive due to the potential rising of node ND12. Output node OD11 and internal node ND13 are already connected electrically, and are set at the same voltage level. MOS transistor PQ11 in this state has the gate-source voltage at most at a level lower in absolute value than the threshold voltage thereof, and maintains the non-conductive state.

MOS transistors NQ11, NQ12, PQ11 and PQ12 each are of the enhancement type and turn non-conductive only when the gate-source voltage thereof attains equal to or higher in absolute value than the threshold voltage.

At time t3, control signal φCTZ falls from the level of power supply voltage VCC to the level of ground voltage GND. In accordance with the falling of control signal φCTZ, the charge pumping by capacitance element C13 lowers the voltage level of node ND13 from the high voltage of 2·VCC to power supply voltage VCC, and MOS transistor PQ11 has the gate much lower in potential than the source thereof, to turn conductive for coupling electrically node ND12 to output node OD11.

When the voltage level of output node OD11 is lower than the final voltage level of 2·VCC, positive charges are supplied from internal node ND12 to output node OD11, and the voltage level of output node OD11 rises. In this operation of supplying charges to output node OD11, MOS transistor PQ12 has the gate equal to or higher in potential than the source, and maintains the non-conductive state. Therefore, no current flows.

At time t4, control signal φCTZ rises from the level of ground voltage GND to the level of power supply voltage VCC. The charge pumping by capacitance element C13 raises the voltage level of node ND13 from power supply voltage VCC to the high voltage of 2·VCC. MOS transistor PQ11 has the gate equal to or higher in potential than the source thereof, and turns non-conductive.

In the transition period when the voltage level of output node OD11 is lower than the high voltage of 2·VCC, MOS transistor PQ12 turns conductive. Even in this state, however, positive charges are supplied from node ND13 to output node OD11, to raise the voltage level of output node OD11.

Particularly, when the voltage level of output node OD11 is lower than the high voltage of 2·VCC in the transition period of the initial stage of the charge pumping operation, normally, the voltage level of node ND12 is lower than the high voltage of 2·VCC, and output node OD11 is at a substantially the same voltage level (the voltage level of node ND13 is set to the same voltage level as the output node before the transfer of charges). In this state, therefore, MOS transistor PQ12 of the enhancement type has the gate-source voltage not higher than the absolute value of the threshold voltage, and maintains the non-conductive state.

In this transition period, since MOS transistor PQ11 has the gate equal to or higher in potential than the source (output node OD11), and therefore maintains the non-conductive state. Thus, no ineffective current flows from output node OD11 to internal node ND12.

At time t5, control signal φCPZ falls from the level of power supply voltage VCC to the level of ground voltage GND. The charge pumping by capacitance element C12 lowers the voltage level of node ND12 from the high voltage of 2·VCC to power supply voltage VCC. Node ND11 is at the level of power supply voltage VCC. MOS transistor NQ12 has the source and gate equal in potential to each other, and maintains the non-conductive state.

The gate potential of MOS transistor PQ12 becomes lower than the voltage level of its source (output node OD11), and MOS transistor PQ12 is turns conductive to connect electrically output node OD11 to internal node ND13. Through the connection of internal node ND13 and output node OD11, MOS transistor PQ11 has the gate and source made equal in potential to each other, and thus maintains the non-conductive state. Therefore, even when internal node ND13 is charged, only a current, which is required for accurately transferring charges to the output node, flows and no ineffective current flows.

In the transition period, even if the voltage level of node ND13 becomes lower than the voltage level of internal node ND12 in boosting of the voltage level of internal node ND12 through control signal φCPZ, MOS transistor PQ11 is held non-conductive (the gate-source voltage is kept not higher than the absolute value of the threshold voltage).

In the transition period, node ND12 may lower below power supply voltage VCC when the voltage on output node OD11 has not yet reached the final voltage level. In this state, node ND11 is at the level of the power supply voltage, and node ND12 is held at the voltage level lower than power supply voltage VCC by the threshold voltage of MOS transistor NQ12. A current, which flows in this state, is only supplied from power supply node PW through MOS transistor 12, to compensate for the voltage level. No ineffective current flows.

At time t6, control signal φPZ rises from the level of ground voltage GND to the level of power supply voltage VCC. The charge pumping by capacitor element C11 raises the voltage level of node ND11 from power supply voltage VCC to the high voltage level of 2·VCC so that MOS transistor NQ12 is turned on, and node ND12 is reliably set to the level of power supply voltage VCC.

Therefore, no ineffective current flows during the periods of precharging to the power supply voltage VCC, charging to the high voltage 2·VCC and transferring of the accumulated charges to the output node, on the internal node ND12 serving as the charge accumulation node, in accordance with control signals φPZ, φCPZ and φCTZ, respectively. Therefore, the charges can be effectively utilized to produce the high voltage of 2·VCC.

In the construction of the voltage generation circuit shown in FIG. 3, the presence of a parasitic capacitance at node ND12 is neglected. If an innegligible parasitic capacitance is present at internal node ND12, the amplitude of the voltage at internal node ND12 is made smaller than the power supply voltage VCC. Thus, the output voltage at output node OD11 is resultantly at a level lower than the high voltage of 2·VCC.

Assuming generally that control signal φCPZ has the amplitude of Vφ similarly to the foregoing embodiment and that power supply node PW is at a voltage VPW, output voltage VOUT from output node OD11 is represented by the following relation (3):

$$VOUT = VPW + V\phi \quad (3)$$

Therefore, the amplitude of control signal φCPZ is determined in accordance with a required voltage level. In the structure shown in FIG. 3, power supply node PW is at a level of power supply voltage VCC, and control signal φCPZ has the amplitude of power supply voltage VCC so that output voltage VOUT can be represented by the following relation (4):

$$VOUT = 2 \cdot VCC \quad (4)$$

It is not necessary that control signals φPZ, φCPZ and φCTZ are equal in voltage to each other in the high level and in the low level. The high levels and the low levels of control signals φPZ, φCPZ and φCTZ may be different from each other, provided that the precharging of internal node ND12, supplying of charges and transferring of the charges can be performed while ensuring the on/off states of MOS transistors NQ11, NQ12, PQ11 and PQ12.

According to the second embodiment of the invention, as described above, the N-channel MOS transistors are cross-coupled, the charging of the charge-accumulation node is performed by utilizing the charge pump operation of the capacitance element. The charges can be supplied to the charge-accumulation node after the MOS transistors are turned non0-conductive. Thus, flow of an ineffective current can be prevented, and a positive high voltage can be efficiently generated.

Third Embodiment

Figure 5:
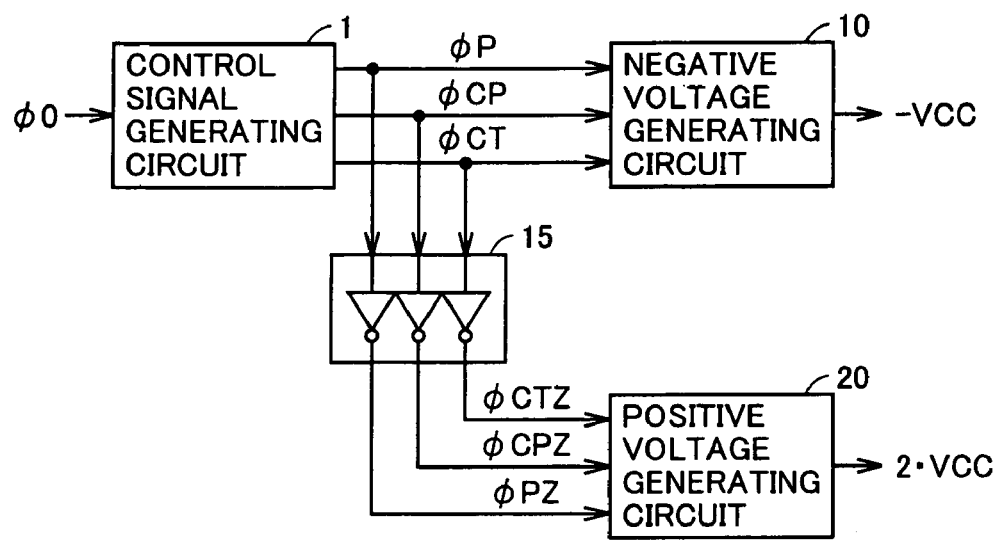
FIG. 5 schematically shows a construction of an internal voltage generating circuit according to a third embodiment of the invention.

FIG. 5 schematically shows a structure of an internal voltage generating circuit according to a third embodiment of the invention. In FIG. 5, the internal voltage generating circuit includes a control signal generating circuit 1 for producing control signals φP, φCP and φCT in accordance with a repetition signal φ0, a negative voltage generating circuit 10 for generating a negative voltage −VCC in accordance with control signals φP, φCP and φCT received from control signal generating circuit 1, an inverting circuit 15 for inverting control signals φP, φCP and φCT to produce control signals φPZ, φCPZ and φCTZ, respectively, and a positive voltage generating circuit 20 for producing a positive voltage of 2·VCC in accordance with control signals φPZ, φCPZ and φCTZ applied from inverting circuit 15.

Negative voltage generating circuit 10 has a construction similar to that of the voltage generating circuit shown in FIG. 1, and positive voltage generating circuit 20 has a construction similar to that of the voltage generating circuit shown in FIG. 3. Control signal generating circuit 1 is provided commonly to negative and positive voltage generating circuits 10 and 20. The internal voltages at intended levels of −VCC and 2·VCC can be efficiently produced with a reduced occupation area.

Figure 6:
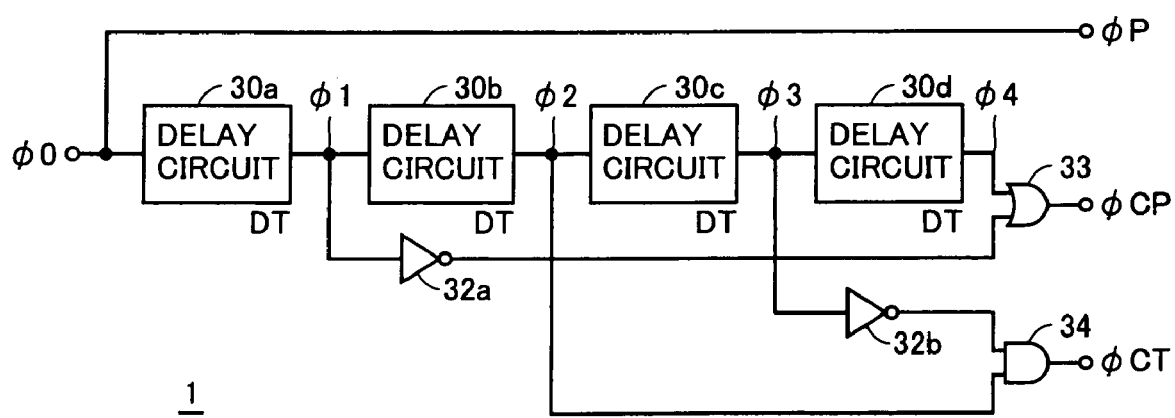
FIG. 6 schematically shows a structure of a control signal generating circuit shown in FIG. 5.

FIG. 6 schematically shows a construction of control signal generating circuit 1 shown in FIG. 5. In FIG. 6, control signal generating circuit 1 includes cascaded delay circuits 30a-30d of four stages for receiving repetition signal φ0, an inverter 32a receiving an output signal φ1 of delay circuit 30a, an inverter 32b receiving an output signal φ3 of delay circuit 30c, and an OR circuit 33 receiving the output signal of inverter 32a and an output signal φ4 of delay circuit 30d to produce control signal φCP, and an AND circuit 34 receiving output signal φ2 of delay circuit 30b and the output signal of inverter 32b to produce control signal φCT.

Each of delay circuits 30a-30d is formed of an even number of stages of cascaded inverters, and has a delay time DT.

Figure 7:
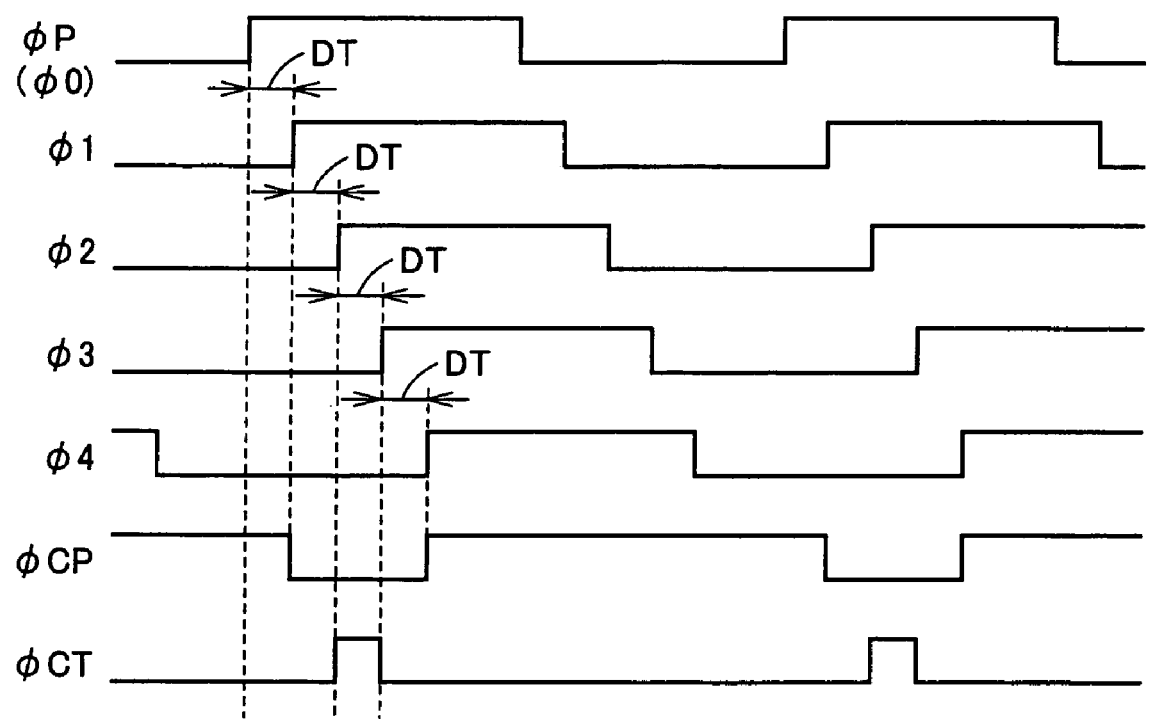
FIG. 7 is a timing chart illustrating an operation of the circuit shown in FIG. 6.

FIG. 7 is a signal waveform diagram illustrating an operation of control signal generating circuit 1 shown in FIG. 6. Referring to FIG. 7, the operation of control signal generating circuit 1 shown in FIG. 6 will now be described.

Repetition signal φ0 has a constant period, and is used also as control signal φP for precharging. Delay circuits 30a-30d delay the received signals by a predetermined time DT to produce delayed signals φ1-φ4, respectively.

OR circuit 33 receives the output signal of inverter 32a and output signal φ4 of delay circuit 30d to produce control signal φCP for accumulating charges. Therefore, the period in which control signal φCP is at an L level (logical low level), is provided by the period in which output signal φ4 of delay circuit 30d is at an L level and output signal φ1 of delay circuit 30a is at an H level (logical high level). Therefore, control signal φCP falls to the L level when output signal φ1 of delay circuit 30a rises to the H level, and rises to the H level when output signal φ4 of delay circuit 30a rises to the H level. Accordingly, control signal φP is maintained at the L level for a time period of 3·DT.

Control signal φCT applied from AND circuit 34 for the charge transfer is at the H level when output signal φ2 of delay circuit 30b is at the H level and the output signal of inverter 32b is at the H level. Therefore, control signal φCT attains the H level when output signal φ2 of delay circuit 30b rises to the H level, and attains the L level when output signal φ3 of delay circuit 30c attains the H level. Control signal φCT is maintained at the H level for the period of DT.

The high levels of output signals φ1-φ4 of delay circuits 30a-30d are at the level of power supply voltage VCC, and the low levels thereof are at the level of ground voltage GND. In this case, as for control signals φP, φCP and φCT, the high level is at the level of power supply voltage VCC and the low level is at a level of ground voltage GND. By changing the level of the operation power supply voltage of control signal generating circuit 1, it is possible to change the amplitudes, and the voltage levels of the high level and the low level of control signals φP, φCP and φCT.

Repetition signal φ0 may be produced from an internal oscillator circuit, or may be formed of a clock signal externally, repetitively supplied for the signal transfer, setting of operation cycles and others.

Positive voltage generating circuit 20 operates in accordance with control signals φPZ, φCPZ and φCTZ produced by inverting control signals φP, φCP and φCT, respectively. By utilizing these control signals, it is possible to achieve the phase relationships between the control signals in the timing charts of FIGS. 2 and 4. Thus, after turning off the MOS transistors, the charge pump operation can be performed to accumulate the charges for generating an internal voltage, and then the MOS transistors for transferring the charges can be made conductive.

In the construction of control signal generating circuit I shown in FIG. 6, delay circuits 30a-30d have the same delay time DT. Delay circuits 30a-30d may have different delay times from each other, provided that the following control signal generation sequence is satisfied. When a predetermined time elapses after the change in voltage level of control signal φP for the precharging, control signal φCP for precharging changes. When a predetermined time elapses thereafter, the voltage level of control signal φCT for the charge transfer changes to perform the charge transfer. When control signal φCT for the charge transfer turns inactive, the logical level of control signal φCP for the charge accumulation changes, and thereafter the voltage level of precharging control signal φCP changes and the precharging is performed. Such sequence is required to be achieved.

The internal voltage generating circuit shown in FIG. 5 includes negative and positive voltage generating circuits 10 and 20 for producing negative voltage −VCC and positive voltage of 2·VCC, respectively. However, even in the case where only one of negative and positive voltage generating circuits 10 and 20 is employed, the internal voltage at an intended level can be efficiently generated by utilizing the control signal generating circuit 1. The internal voltage generated may be at a level different from −VCC and 2·VCC.

According to the third embodiment of the invention, as described above, the delay circuits are cascaded, and the signals in an intended phase relationship are logically processed to produce the control signals for the charge precharging, charging and transferring. Therefore, the control signals for the charge pump operation for generating the internal voltages can be easily produced with a simple circuit construction.

Fourth Embodiment

Figure 8:
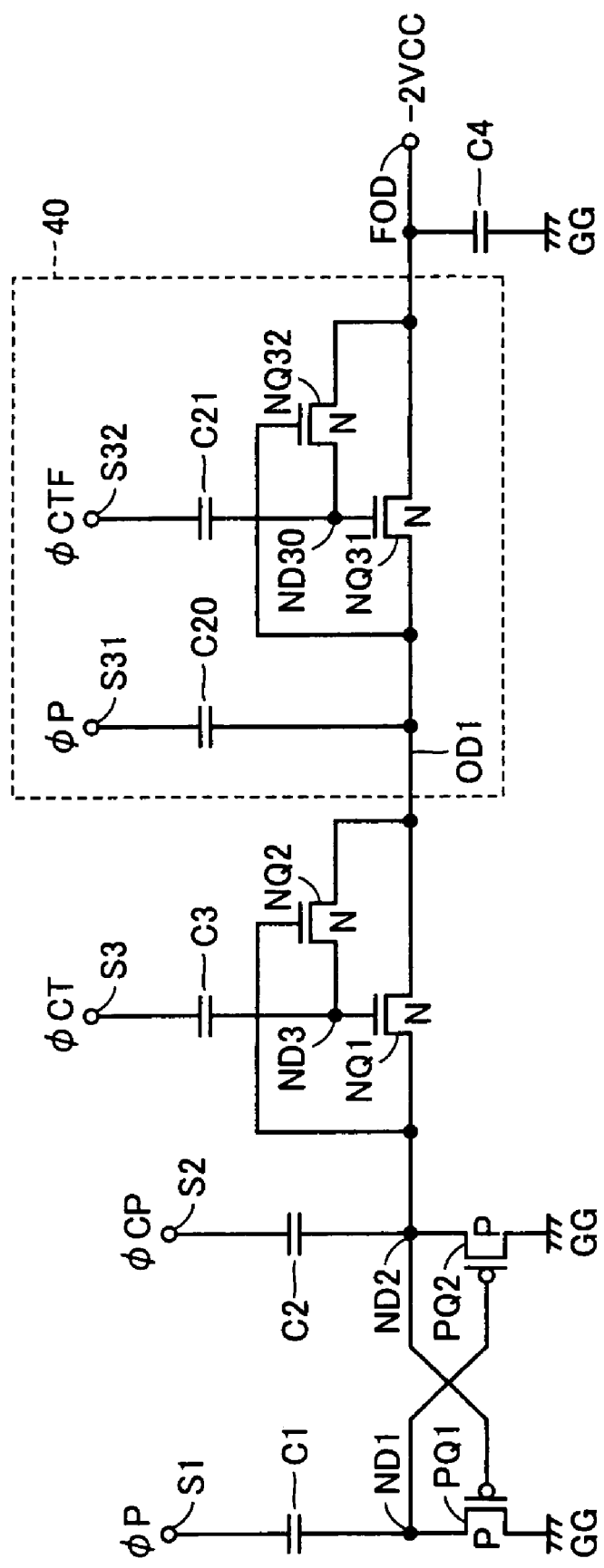
FIG. 8 shows a construction of a voltage generating circuit according to a fourth embodiment of the invention.

FIG. 8 shows a structure of a voltage generating circuit according to a fourth embodiment of the invention. The voltage generating circuit shown in FIG. 8 differs from the voltage generating circuit shown in FIG. 1 in that a voltage drive stage 40 for increasing an absolute value of a produced internal voltage is further arranged between output node OD1 and a final output node FOD.

The construction of the negative voltage generating portion upstream to output node OD1 is the same as that in the voltage generating circuit shown in FIG. 1. Corresponding portions are allotted with the same reference numerals, and description thereof will not be repeated.

A voltage drive stage 40 includes a capacitance element C20 connected between a control signal input node S31 receiving control signal φP and output node OD1, an N-channel MOS transistor NQ31 connected between internal output node OD1 and final output node FOD and having a gate connected to an internal node ND30, an N-channel MOS transistor NQ32 connected between internal node ND30 and final output node FOD and having a gate connected to internal output node OD1, and a capacitance element C21 connected between a control signal input node S32 receiving a control signal φCTF and internal node ND30.

Final output node FOD is provided with a stabilizing capacitance C4, similarly to the first embodiment. However, stabilizing capacitance C4 may be eliminated if variation in output load is small.

Control signal φCTF turns active when negative charges are to be supplied from final output node FOD to internal output node OD1. Control signals φP, φCP and φCT are the same as those in the first embodiment.

Figure 9:
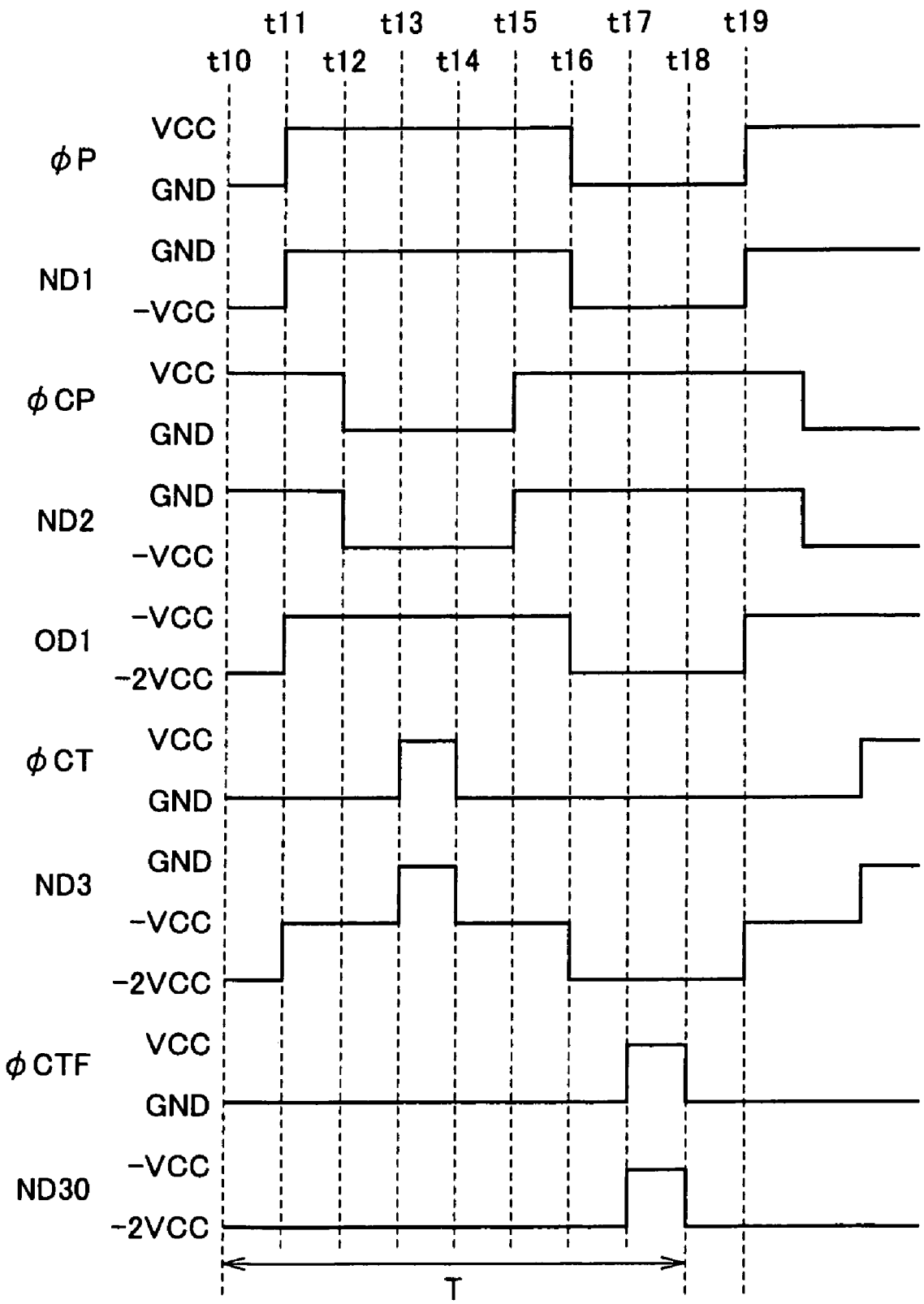
FIG. 9 is a signal waveform diagram illustrating an operation of the circuit shown in FIG. 8.

FIG. 9 is a timing diagram illustrating an operation of the voltage generating circuit shown in FIG. 8. Referring to FIG. 9, description will now be given on the operation of the voltage generating circuit shown in FIG. 8. FIG. 9 illustrates also signal waveforms in the stable state over a time period of 2·T. The following description will be given on the operation in the stable state. In a transition period in the initial stage of the charge pumping operation, an operation is performed as in the stable state although the respective nodes attain different voltage levels.

Control signals φP, φCP and φCT are the same as those in the first embodiment, and therefore, the operation itself of the circuitry upstream to output node OD1 is substantially the same as that in the first embodiment. However, the voltage amplitude of internal output node OD1 is different from that in the first embodiment so that the voltage change on internal node ND3 is different from that in the first embodiment.

At a time t10, control signals φP and φCT are set to the L level, and control signal φCP is set to the H level. In this state, node ND1 is at the level of negative voltage −VCC, and output node OD1 is at the negative voltage level of −2·VCC. Therefore, node ND1 is driven to the level of negative voltage −VCC, and node ND2 is precharged to the level of ground voltage GND. Further, internal output node OD1 is at the negative voltage of −2·VCC, MOS transistor NQ2 is conductive, and internal node ND3 is electrically connected to internal output node OD1, and is held at the same voltage level.

By holding internal node ND3 and internal output node OD1 at the same voltage level, MOS transistor NQ1 is maintained in the non-conductive state.

At time t11, control signal φP rises from the level of ground voltage GND to the level of power supply voltage VCC. Responsively, capacitance element C1 drives node ND1 to the level of ground voltage GND, and the precharge operation on node ND2 is completed. In this state, a capacitance element C20 raises the voltage level of output node OD1 from −2·VCC to −VCC. In this state, node ND2 is at the level of ground voltage GND, and MOS transistor NQ2 maintains the conductive state so that internal node ND3 attains the same voltage level as internal output node OD1, and attains the level of negative voltage −VCC.

MOS transistor NQ1 has the gate (node ND3) and source (internal output node OD1) set to the same potential, and maintains the non-conductive state.

At a time t12, control signal φCP falls from the level of power supply voltage VCC to the level of ground voltage GND, and node ND12 is driven to the level of negative voltage −VCC so that N-channel MOS transistor NQ2 turns non-conductive. In this state, node ND2 is at the level of negative voltage −VCC, and all the gate, source and drain of MOS transistor NQ1 are at the same potential in the stable state, so that MOS transistor NQ1 maintains the non-conductive state. In a transition period, MOS transistor NQ1 has the gate-source voltage not exceeding the threshold voltage as in the first embodiment, and maintains the non-conductive state.

At time t13, control signal φCT rises from the level of ground voltage GND to the level of power supply voltage VCC, and the voltage level of node ND3 rises from negative voltage −VCC to ground voltage GND. MOS transistor NQ1 turns conductive to connect electrically node ND2 to output node OD1, and internal node ND2 and internal output node OD1 are made the same in voltage level. However, in the steady state, internal output node OD1 is already precharged to the level of negative voltage −VCC, and the drain potential and source potential of MOS transistor NQ1 are made equal to each other so that a current does not flow therethrough in the steady state.

At time t14, control signal φCT falls from the level of power supply voltage VCC to the level of ground voltage GND, and the voltage level of node ND3 lowers from ground voltage GND to negative voltage −VCC. Responsively, MOS transistor NQ1 turns non-conductive to isolate node ND2 from internal output node OD1. In the stable state, MOS transistor NQ2 have the gate, drain and source set at the same potential, and does not pass a current.

At time t15, control signal φCP rises from the level of ground voltage GND to the level of power supply voltage VCC, and the voltage level of node ND2 rises from the negative voltage −VCC to ground voltage GND. In accordance with the rising of voltage level of node ND2, MOS transistor PQ1 is turned off for preparing for a next precharge operation.

Further, MOS transistor NQ2 is turned on to connect electrically internal node ND3 and internal output node OD1, and internal node ND3 attains the same voltage level as that on internal output node OD1, i.e., the level of negative voltage −VCC so that MOS transistor NQ1 has the gate and source set at the same voltage, and is kept non-conductive.

At time t16, control signal φP falls from the level of power supply voltage VCC to the level of ground voltage GND, and responsively the voltage on node ND1 lowers from the level of ground voltage GND to the level of negative voltage −VCC. In addition, capacitance element C20 lowers internal output node OD1 from the level of the shallow negative voltage −VCC to the level of the deep negative voltage of −2·VCC. Node ND2 is at the level of ground voltage GND, and MOS transistor NQ2 is in a conductive state so that node ND3 and internal output node OD1 are at the same voltage level, and MOS transistor NQ1 is kept off. Therefore, even if node ND2 is at the level of ground voltage GND, internal output node OD1 lowers to of the deep negative voltage level of −2·VCC, and node ND3 also lowers to the deep negative voltage level of −2·VCC.

In this case, since MOS transistor NQ1 has the source electrically coupled to the gate through MOS transistor NQ2, MOS transistor NQ1 rapidly turns non-conductive, so that an ineffective current hardly flows, and internal output node OD1 reliably lowers to the negative voltage level of −2·VCC.

In a transition period and other, the voltage level of internal node ND30 may possibly exceed the voltage level of internal output node OD1. However, internal node ND30 is once connected electrically to final output node FOD, and a difference in voltage level between internal node ND30 and internal output node OD1 is small in such a state. Therefore, MOS transistor NQ1 maintains the non-conductive state owing to its threshold voltage.

At time t17, control signal φCTF rises from the level of ground voltage GND to the level of power supply voltage VCC, and the voltage level of node ND30 rises from the deep negative voltage of −2·VCC to the shallow negative voltage −VCC. Responsively, MOS transistor NQ31 turns conductive to couple electrically output node OD1 to final output node FOD. When the voltage level of final output node FOD is higher than the deep negative voltage of −2·VCC, negative charges are supplied from internal output node OD1 to final output node FOD. In this charge transfer operation, MOS transistor NQ2 has the gate and the source (final output node FOD) set to the same potential, and maintains the non-conductive state. Thus, the charges are efficiently transferred from internal output node OD1 to final output node FOD.

At time t18, control signal φP rises from the level of ground voltage GND to the level of power supply voltage VCC. Responsively, node ND1 returns from the level of the shallow negative voltage −VCC to the level of ground voltage GND, and output node OD1 rises from the level of deep negative voltage of −2·VCC to the level of the shallow negative voltage −VCC. In this state, node ND2 is at the ground voltage level, and node ND3 rises in voltage level from the deep negative voltage of −2·VCC to negative voltage −VCC, similarly to output node OD1.

At time t19 and subsequently, the operations described above are repeated.

When output node OD1 lowers to the level of the deep negative voltage of −2·VCC to lower the voltage level of node ND3 to the level of deep negative voltage of −2·VCC, the voltage level of node ND3 can be reliably and rapidly changed in accordance with the voltage level of output node OD1 with capacitance element C20 having the capacitance value much larger than that of capacitance element C3.

In the initial period at start of the charge pumping operation, the voltage of final output node FOD lowers to −2·VCC after the voltage on output node OD1 changes between −VCC and −2·VCC. The operation of voltage drive stage 40 in this transition period is similar to that of the voltage generating circuit previously described in connection with the first embodiment.

Voltage drive stage 40 has a structure similar to that of an output stage (charge transfer stage) of a circuit generating the negative voltage −VCC and arranged in −VCC generating circuit at the preceding stage. Therefore, the deep negative voltage of −2·VCC can be efficiently generated without causing an ineffective current flow.

According to the fourth embodiment of the invention, as described above, the output stage of the circuit generating shallow negative voltage −VCC is further connected to the charge pump capacitance of the output node, and the output stage (charge transfer stage) of the same structure as the output stage of the −VCC generating circuit is arranged to form the voltage drive stage. Thereby, the charges can be efficiently utilized to generate the negative voltage of −2·VCC with low power consumption.

Fifth Embodiment

Figure 10A:
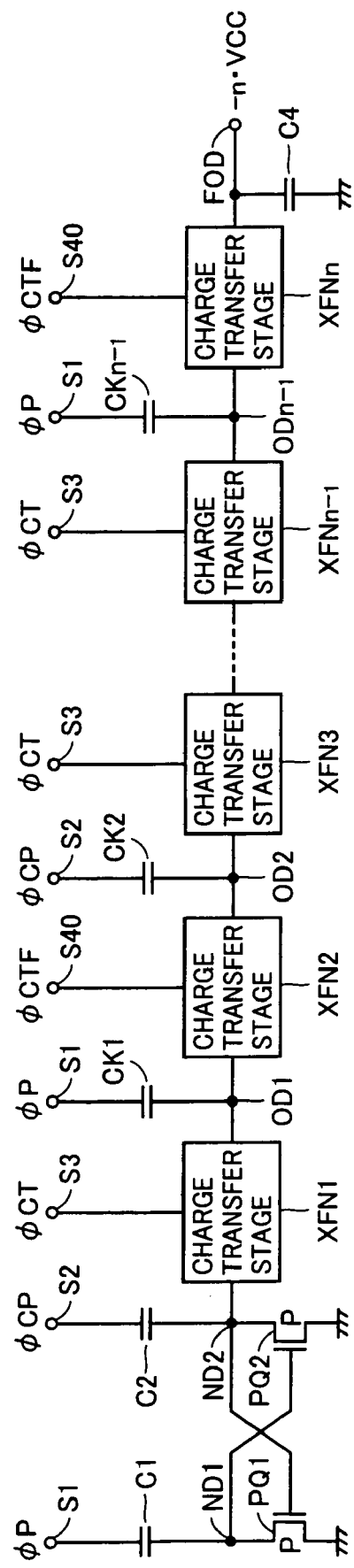
FIG. 10A shows a construction of a voltage generating circuit according to a fifth embodiment of the invention.

FIG. 10A schematically shows a construction of a voltage generating circuit according to a fifth embodiment of the invention. The voltage generating circuit shown in FIG. 10A includes charge transfer stages XFN1, XFN2, . . . and XFNn cascaded between node ND2 and output node FOD.

P-channel MOS transistors PQ1 and PQ2 are cross-coupled and arranged between the ground node and nodes ND1 and ND2. Node ND1 receives control signal φP for precharging via capacitance element C1, and node ND2 receives control signal φCP for producing charges via capacitance element C2. MOS transistors PQ1 and PQ2 as well as capacitance elements C1 and C2 have the same structures as those shown in FIGS. 1 and 8, and nodes ND1 and ND2 are changed in voltage level between ground voltage GND and negative voltage −VCC in accordance with control signals φP and φCP.

Capacitance elements CK1–CKn−1 are connected to output nodes OD1–ODn−1 of charge transfer stages XFN1–XFNn−1, respectively. In charge transfer stages XFN1, XFN3, . . . and XFNn−1 at odd-numbered stages, capacitance elements CQ1 . . . CQn−1 arranged at respective output nodes OD1, OD3, . . . and ODn−1 receive control signal φP via control signal input nodes S1. In charge transfer stages XFN2 . . . at even-numbered stages, capacitance elements CQ2 . . . arranged at respective output nodes OD2 . . . receive control signal φCP via control signal input nodes S2. Charge transfer stages XFN1–XFNn alternately receive control signals φCT and φCTF. The charge transfer stage and the capacitance element arranged at a respective input node (i.e., the output node of the upstream charge transfer stage) form the voltage drive stage.

Final output node FOD is connected to stabilizing capacitance element C4. If the voltage on final output node FOD is stable, stabilizing capacitance element C4 may not be provided.

Figure 10B:
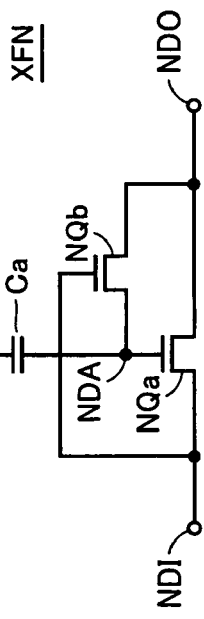
FIG. 10B shows a structure of a charge transfer stage shown in FIG. 10A.

FIG. 10B shows a construction of charge transfer stages XFN1–XFNn. Charge transfer stages XFN1–XFNn have the same structure, and FIG. 10B shows charge transfer stage XFN generally representing charge transfer stages XFN1–XFNn.

Charge transfer stage XFN includes an N-channel MOS transistor NQa connected between an input node NDI and an output node NDO, an N-channel MOS transistor NQb connected between output node NDO and an internal node NDA and having a gate connected to input node ND1, and a capacitance element Ca connected between control signal input node Sa and internal node NDA.

Charge transfer stage XFN is equivalent in construction to voltage drive stage 40 shown in FIG. 8 other than capacitance element C20. Control signal input node Sa receives control signal φCT or φCTF for controlling the charge transfer. The precharging of input node ND1 and the charge transfer are alternately performed in charge transfer stages XFN1–XFNn, so that a voltage drop by −VCC can be caused in each of charge transfer stages XFN1–XFNn, and a voltage of −n·VCC can be generated on final output node FOD.

Figure 11:
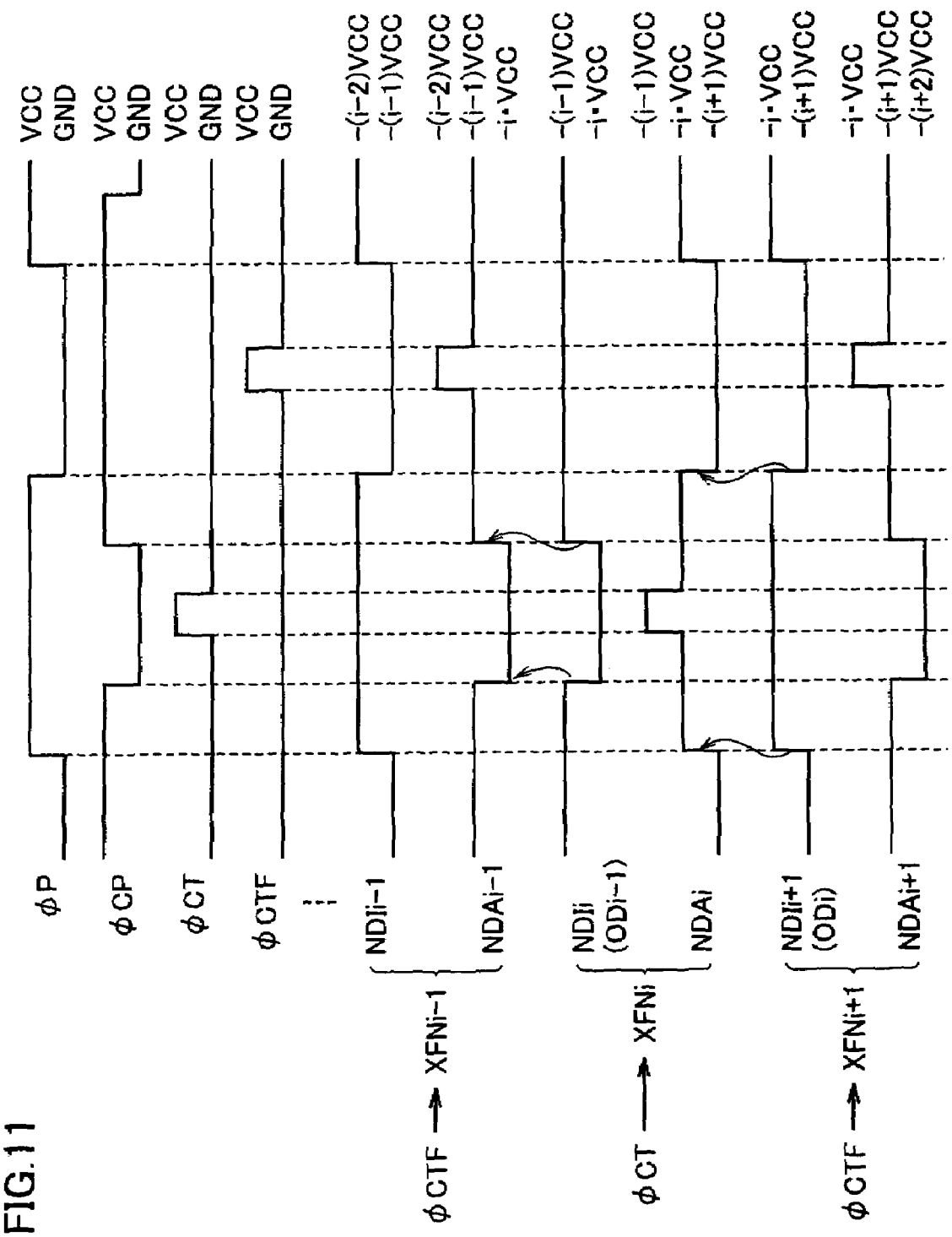
FIG. 11 is a signal waveform diagram illustrating an operation of the circuits shown in FIGS. 10A and 10B.

FIG. 11 is a timing chart representing an operation of the voltage generating circuit shown in FIGS. 10A and 10B. FIG. 11 illustrates signal waveforms on the output and input nodes of charge transfer stages XFNi−1, XFNi and XFNi−1. Capacitance elements Ca of charge transfer stages XFNi−1, XFNi and XFNi+1 are supplied with control signals φCTF, φCT and φCTF, respectively. Referring to FIG. 11, description will now be given on the operation of the voltage generating circuit shown in FIGS. 10A and 10B.

When control signal φP rises from ground voltage GND to power supply voltage VCC, the voltage level of input node NDIi−1 of charge transfer stage XFNi−1 is raised by the charge pump operation of corresponding capacitance element CKi−2. In this case, the voltage level changes from a negative voltage of −(i−1)·VCC to a negative voltage of −(i−2)·VCC. In this state, internal node NDAi−1 is at the voltage of −(i−1)·VCC, and MOS transistor NQa in charge transfer stage XFNi−1 maintains the non-conductive state.

In charge transfer stage XFNi+1, the charge pump operation is likewise effected on input node NDIi+1 in accordance with control signal φP, and the voltage level thereof changes from −(i+1)·VCC to −i·VCC. Input node NDIi+1 of charge transfer stage XFNi+1 corresponds to output node ODi of charge transfer stage XFNi. In this case, MOS transistor NQb in charge transfer stage XFNi is in a conductive state, and accordingly the level of node ND11 changes from a voltage of −(i+1)·VCC to −i·VCC. Even in this state, MOS transistor NQa in charge transfer stage XFNi has the gate lower in potential than its source, and therefore maintains the non-conductive state.

When control signal φCP falls from the level of power supply voltage VCC to the level of ground potential GND, capacitance element CKi in charge transfer stage XFNi performs the charge pumping operation to change the voltage on input node NDIi from −(i−1)·VCC to −i·VCC. In this operation, in charge transfer stage XFNi−1, node ND1i−1 is at the voltage level of −(i−2)·VCC and MOS transistor NQb is in a conductive state, so that node NDAi−1 rises from the voltage level of −(i−1)·VCC to the voltage level of −i·VCC.

When a predetermined period elapses, control signal φCT is driven to the level of power supply voltage VCC. In charge transfer stage XFNi, the charge pumping by capacitance element Ca raises the voltage level of input node NDAi from −(i+1)·VCC to −i·VCC, and MOS transistor NQa turns conductive. Accordingly, the charges are driven via MOS transistor NQa in charge transfer stage XFNi. In this state, node NDIi+1 is at the voltage level of −i·VCC, and the voltage level of input node ND1i in charge transfer stage XFNi is made equal to the voltage level of input node NDIi+1 in charge transfer stage XFNi+1.

When control signal φCT falls to the ground voltage level again, the voltage level of input node NDAi in charge transfer stage XFNi is lowered by power supply voltage VCC to attain the voltage level of −i·VCC, and MOS transistor NQa in charge transfer stage XFNi turns nonconductive.

Then, control signal φCP rises from the level of ground voltage GND to the level of power supply voltage VCC, and the voltage level of input node NDIi of charge transfer stage XFNi rises. Responsively, internal node NDAi−1 in charge transfer stage XFNi−1 is raised in voltage level through MOS transistor NQb in accordance with the voltage level of node NDIi, and is set to the voltage level of −(i−1)·VCC.

In accordance with control signal φCP, the voltage level of internal node NDAi+1 in charge transfer stage XFNi+1 likewise lowers, to render corresponding MOS transistor NQa non-conductive when the voltage level of the output node ODi+1 lowers.

When a predetermined time elapses, control signal φP falls from the level of power supply voltage VCC to the level of ground voltage GND. Responsively, the capacitance element in charge transfer stage XFNi+1 performs the charge pump operation on input node NDIi+1, and the voltage level thereof lowers from −i·VCC to −(i+1)·VCC. This voltage drop is transmitted to internal node NDAi of charge transfer stage XFNi via MOS transistor NQb, and this MOS transistor NQb is reliably made non-conductive.

After a predetermined time further elapses, control signal φCTF attains and maintains the level of power supply voltage VCC for a predetermined period, and the voltage levels of internal nodes NDAi−1 and NDAi+1 in charge transfer stages XFNi−1 and XFNi+1 are raised by power supply voltage VCC so that corresponding MOS transistors NQa turns conductive to transfer the charges.

In the above operation, as for charge transfer stage XFNi, the voltage level of internal node NDAi is equal to the voltage level of input node NDIi+1 of charge transfer stage XFNi+1, and therefore to the voltage level of output node OD1 of charge transfer stage XFNi, and thus MOS transistor NQa maintains the non-conductive state to prevent backflow of a current in charge transfer stage XFNi.

Accordingly, by cascading charge transfer stages XFN1−XFNn, and by alternately performing the precharging of the input nodes and the charging of the associated internal nodes in accordance with phase-controlled control signals in these charge transfer stages, the backflow of the current can be reliably prevented from occurring, and the generated voltages can be decreased by the voltage VCC in the charge transfer stages. In the structure of charge transfer stages XFN1−XFNn of n stages, a voltage of −n·VCC is produced on output node FOD. Thus, it is possible to generate a negative voltage at an intended voltage level, and a required voltage level can be stably generated with low power consumption even under a low power supply voltage condition.

Figure 12:
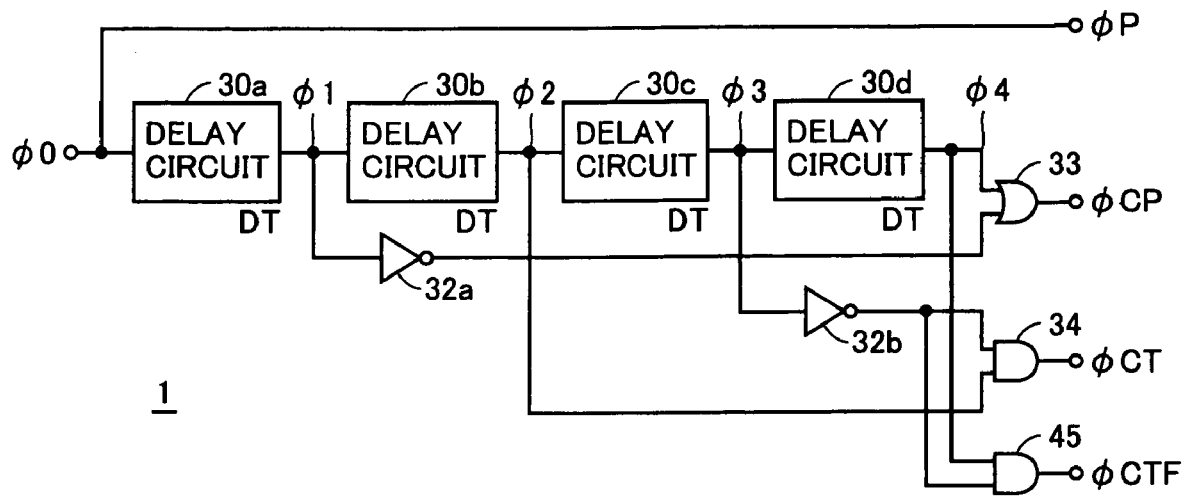
FIG. 12 schematically shows a structure of a circuit generating a control signal shown in FIG. 10A.

FIG. 12 schematically shows a construction of a circuit for generating the control signals used in the voltage generating circuit shown in FIGS. 10A and 10B. In addition to the components of the control signal generating circuit shown in FIG. 6, the control signal generating circuit shown in FIG. 12 includes an AND circuit 45 receiving output signal φ4 of delay circuit 30d and the output signal of inverter 32b to produce control signal φCTF. Other components of the control signal generating circuit shown in FIG. 12 are the same as those of the control signal generating circuit shown in FIG. 6. Corresponding portions are allotted with the same reference numerals, and description thereof will not be repeated.

Figure 13:
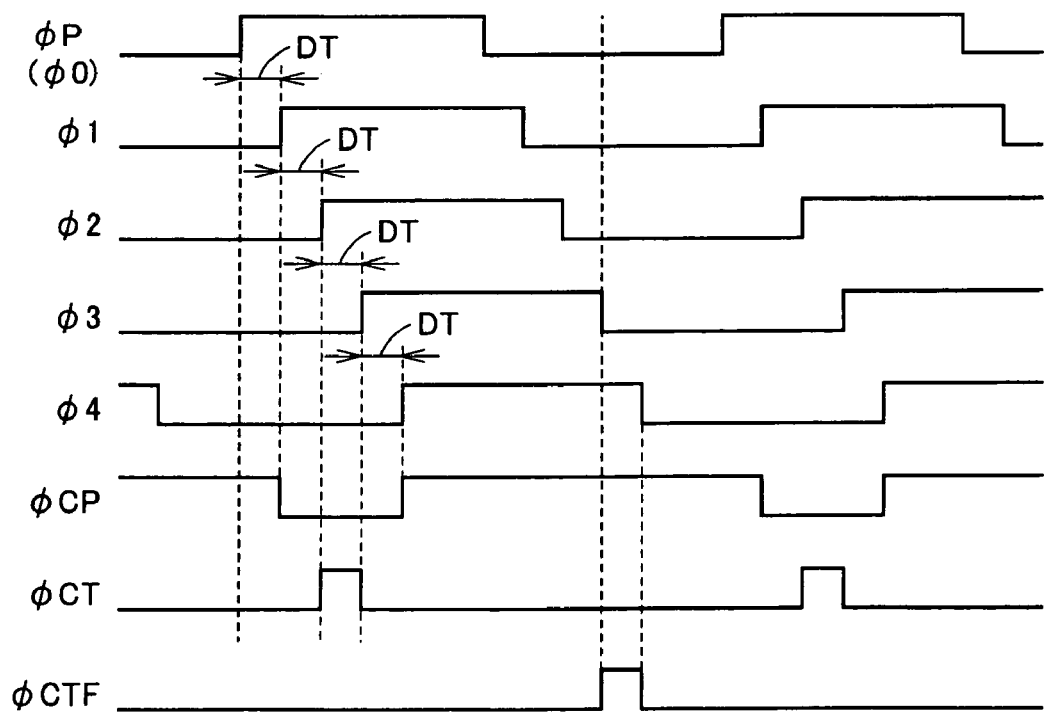
FIG. 13 is a signal waveform diagram illustrating an operation of a circuit shown in FIG. 12.

According to the construction of the control signal generating circuit shown in FIG. 12, AND circuit 45 generates control signal φCTF at the H level when output signal φ4 of delay circuit 30d is at the H level and the output signal of inverter 32b is at the H level. As shown in FIG. 13, therefore, control signal φCTF is at the H level when output signals φ3 and φ4 of delay circuits 30c and 30d are at the L- and H levels, respectively. Other control signals φP, φCP and φCT are generated from the same components as those in the circuit shown in FIG. 6, and have the same timing relationship. By utilizing the control circuit shown in FIG. 12, for each charge transfer stage, when the negative charges are supplied on its input node to be ready for transferring the charges, the control signal for charge transfer can be applied accurately to transfer the charges to the output node. In addition, the backflow of the current can be prevented.

According to the fifth embodiment of the invention, as described above, the plurality of charge transfer stages are cascaded, and the charge transferring and the precharging of the input node are alternately performed in the respective charge transfer stages, so that a deep negative voltage can be produced with low power consumption.

Sixth Embodiment

Figure 14:
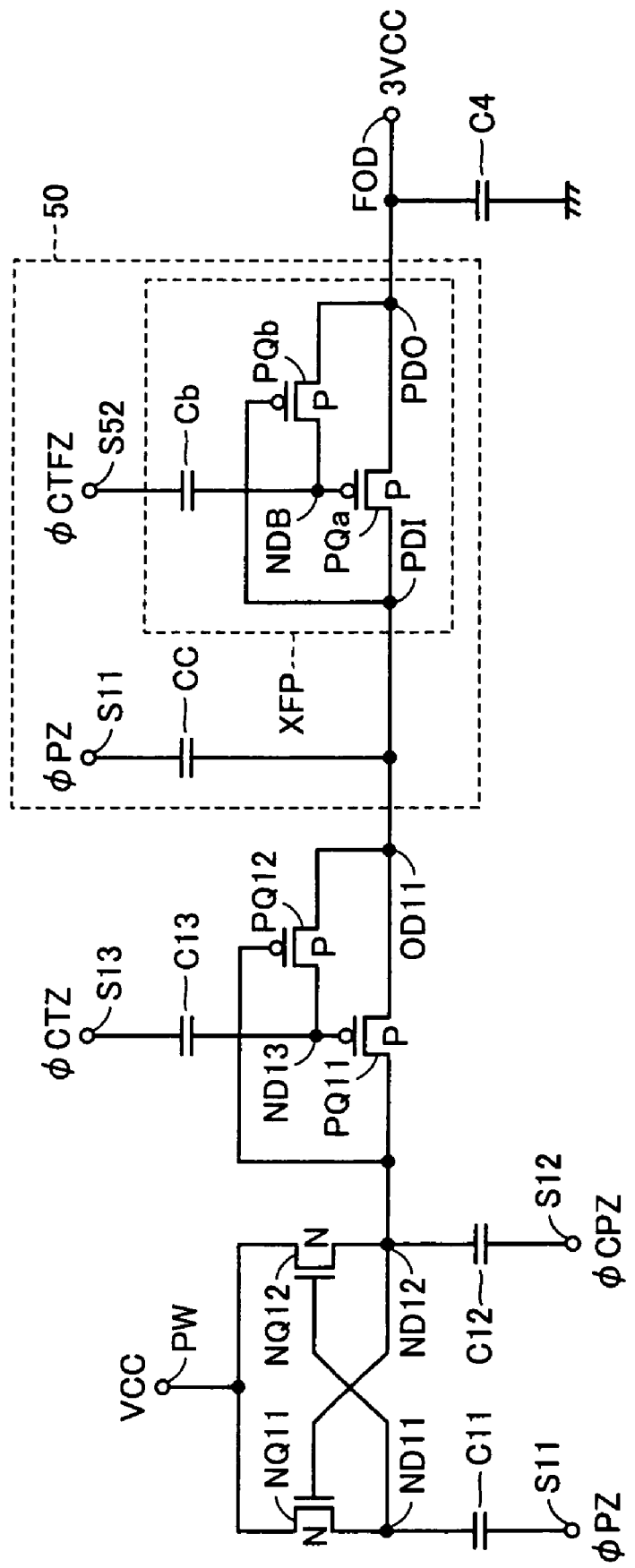
FIG. 14 shows a construction of a voltage generating circuit according to a sixth embodiment of the invention.

FIG. 14 shows a construction of a voltage generating circuit according to a sixth embodiment of the invention. In addition to the components of the voltage generating circuit shown in FIG. 3, the voltage generating circuit shown in FIG. 14 further includes a voltage drive stage 50 for transmitting charges of output node OD11 to final output node FOD in accordance with control signals φPZ and φCTFZ.

Voltage drive stage 50 includes a capacitance element CC performing a charge pump operation on internal output node OD11 in accordance with control signal φPZ, and a charge transfer stage XFP transmitting the charged electric charges in capacitance element CC to final output node FOD in accordance with control signal φCTFZ.

Charge transfer stage XFP includes a P-channel MOS transistor PQa connected between internal output node OD11 and final output node FOD and having a gate connected to an internal node NDB, a P-channel MOS transistor PQb connected between internal node NDB and final output node FOD and having a gate connected to internal output node OD11, and a capacitance element Cb connected between a control signal input node S52 receiving control signal φCTFZ and internal node NDB. Charge transfer stage XFP has an input node PDI connected to internal output node OD11, and an output node POD connected to final output node FOD.

In the voltage generating circuit shown in FIG. 14, a circuit, arranged upstream to output node OD11 for generating a voltage of 2·VCC, is formed of a portion for generating the voltage boosting charges and a portion for transferring the voltage boosting charges. These charge generating portion and the charge transferring portion have the same constructions as those in the circuit shown in FIG. 1. Corresponding components are allotted with the same reference numbers, and description thereof will not be repeated.

Figure 15:
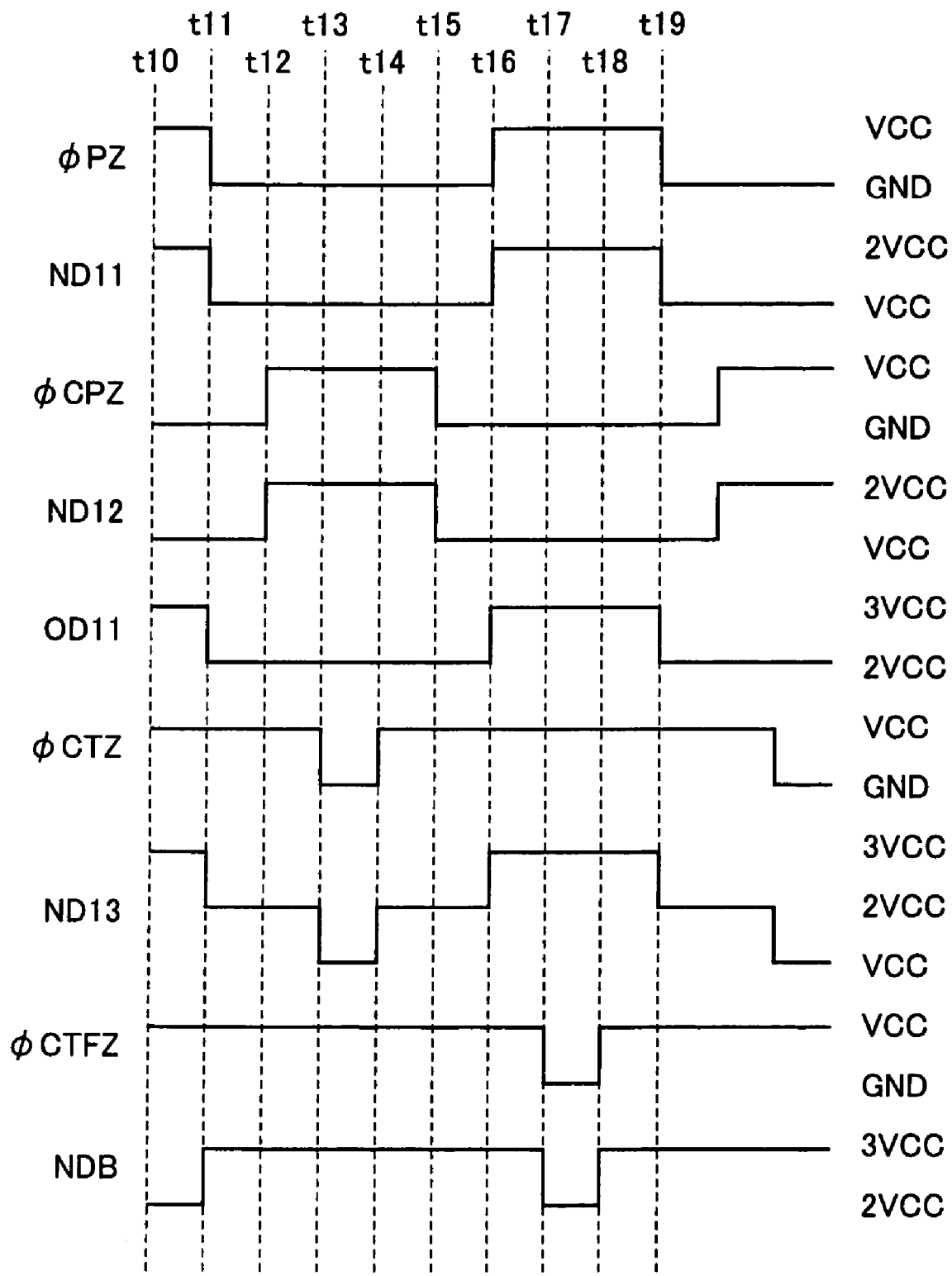
FIG. 15 is a signal waveform diagram illustrating an operation of a circuit shown in FIG. 14.

FIG. 15 is a signal waveform diagram showing an operation in the stable state of the voltage generating circuit shown in FIG. 14. Referring to FIG. 15, an operation in the stable state of the voltage generating circuit shown in FIG. 14 will now be described.

The voltage generating circuit shown in FIG. 14 is the same as the voltage generating circuit shown in FIG. 8, provided that the conductivities of the transistors, polarities of the control signals and polarities of the voltages are exchanged. Basically, in the voltage generating circuit shown in FIG. 14, the charge pump operation for the charges of node ND12 is the same as that of the circuit shown in FIG. 3, and capacitance element C12 changes the voltage level of node ND12 between power supply voltage VCC and the high voltage of 2·VCC in accordance with control signal φCPZ. Capacitance element CC changes the voltage level of internal output node OD11 through the charge pumping operation in accordance with control signal φPZ. Therefore, internal output node OD11 changes between the voltages of 2·VCC and 3·VCC. Since the voltage level of internal output node OD11 changes up to 3·VCC, the voltage level of internal node ND13 changes between power supply voltage VCC and the high voltages of 2·VCC and 3·VCC over three stages.

At time t11, control signal φPZ falls from power supply voltage VCC to ground voltage GND. Responsively, output node OD11 is set to the voltage level of 2·VCC by the charge pumping operation of capacitance element CC. In this operation, node ND12 is at the level of power supply voltage VCC, and MOS transistor PQ12 is in a conductive state, so that node ND13 attains the voltage level of 2·VCC similarly to internal output node OD11. Accordingly, MOS transistor PQ11 has gate and the source at the same potential, and turns non-conductive.

At time t12, control signal φCPZ rises to the level of power supply voltage VCC. Responsively, the voltage level of node ND12 attains the level of high voltage of 2·VCC, so that MOS transistor PQ12 is turned off. In this state, MOS transistor PQ11 has the gate, drain and source set at the same voltage level, and maintains off.

In voltage drive stage 50, control signal φCTFZ is at the level of power supply voltage VCC, node NDB is at the level of 3·VCC and MOS transistor PQa is in an off state. Since internal output node OD11 is at the voltage level of 2·VCC, MOS transistor PQb maintains the conductive state, but a current does not flow through MOS transistor PQb because node NDB and final output node FOD are at the same voltage level.

At a time t13, control signal φCTZ falls from the level of power supply voltage VCC to the level of ground voltage GND. Responsively, the voltage level of node ND13 lowers from the voltage of 2·VCC to power supply voltage VCC so that MOS transistor PQ11 turns conductive, to transfer the charges between internal output node OD11 and internal node ND12. This charge transfer operation completes when internal node ND12 and output node OD11 attain the same potential level.

In the charge transfer operation, MOS transistor PQ12 maintains the non-conductive state because its gate and source are set to the same voltage level. In this charge transfer operation, node NDB is at the voltage level of 3·VCC, internal output node OD11 is at the voltage level of 2·VCC, and P-channel MOS transistor PQa for the charge transfer maintains the non-conductive state.

At a time t14, control signal φCPZ rises from the level of ground voltage to the level of power supply voltage VCC, and responsively the voltage level of node ND13 rises from power supply voltage VCC to the high voltage of 2·VCC, so that MOS transistor PQ11 turns non-conductive. In this operation, MOS transistor PQ12 maintains the non-conductive state owing to its threshold voltage because node ND12 is at the voltage level of 2·VCC.

At time t15, control signal φCPZ falls from power supply voltage VCC to ground voltage GND. Responsively, the charge pumping by capacitance element C12 lowers the voltage level of node ND12 from the high voltage of 2·VCC to power supply voltage VCC. When the voltage level of node ND12 lowers to the level of power supply voltage VCC to turn on P-channel MOS transistor PQ12, for electrically connecting nodes ND13 and OD11 together, node ND13 and internal output node OD11 are at the equal voltage level of 2·VCC, and a current does not flow in the stable state. MOS transistor PQ11 maintains the non-conductive state because its gate and source are at the same potential level.

At time t16, control signal φPZ rises from the level of ground voltage GND to the level of power supply voltage VCC, and responsively, node ND11 is raised to the level of power supply voltage VCC so that node ND12 is reliably precharged to the level of power supply voltage VCC.

When control signal φPZ rises, capacitance element CC performs the charge pump operation to raise output node OD1 I from the level of 2·VCC to the level of 3-VCC. When the voltage level of output node OD11 rises to the voltage level of 3·VCC, node ND12 is at the level of power supply voltage VCC, and MOS transistor PQ12 is rendered conductive, so that node ND13 rises to the voltage level of 3·VCC, and MOS transistor PQ11 maintains the non-conductive state.

At time t17, control signal φCTFZ falls from the level of power supply voltage VCC to the level of ground voltage GND. Responsively, the charge pumping by capacitance element Cb lowers the voltage level of node NDB from the voltage of 3-VCC to the voltage of 2·VCC, and MOS transistor PQa is turned on to transfer the charges from output node OD11 to final output node FOD so that final output node FOD is reliably kept at the voltage level of 3·VCC. In this charge transfer operation, node NDB is at the voltage level of 2·VCC, and output node OD11 and final output node FOD are at the same voltage level higher than that of node NDB. Thus, MOS transistor PQb maintains the non-conductive state.

At time t18, control signal φCTFZ rises from the level of ground voltage GND to the level of power supply voltage VCC again. Responsively, the charge pumping by capacitance element Cb raises the voltage level of node NDB to the voltage of 3·VCC, and MOS transistor PQa turns non-conductive.

At time t19, control signal φPZ falls from the level of power supply voltage VCC to the level of ground voltage GND so that the voltage level of output node OD11 lowers to 2·VCC. In this operation, MOS transistor PQ12 is in an on-state, so that the voltage level of node ND13 lowers from 3·VCC to 2·VCC. Subsequently, the above operations are repeated.

Accordingly, since one voltage drive stage 50 is arranged for precharging the output node to transfer the charges in the operation of precharging the internal node, the voltage on this output node can be raised by voltage VCC, and the voltage of 3·VCC can be produced on final output node FOD.

For the simplicity reason, no description is given on the operation in the transition period of the initial charge pump operation. However, an operation is performed similarly to that in the circuit generating the negative voltage of −2·VCC in the fourth embodiment, and the threshold voltages of the transistors of the enhancement type are utilized to raise gradually the voltage level of the final output voltage while preventing the occurrence of an ineffective current flow.

Stabilizing capacitance C4 provided at final output node FOD may be removed if the load variation of final output node FOD is small.

Control signals φPZ, φCPZ, φCTZ and φCTFZ can be produced by inverting the output signals of the control signal generating circuits shown in FIG. 12.

Similarly to the second embodiment, therefore, control signals φPZ, φCPZ, φCTZ and φCTFZ are not required to change between ground voltage GND and power supply voltage VCC, and may be replaced with signals changing between any intended voltages, provided that the on/off conditions of the MOS transistors of the components are met.

According to the sixth embodiment, as described above, the capacitance element for the charge pump is arranged at the output node of the circuit generating the voltage of 2·VCC, and one stage of charge transfer stage is further arranged in which the on/off of charge transferring transistor PQa is controlled by the capacitance element and the MOS transistor detecting the potential of the output node. Accordingly, flow of ineffective charges is prevented, and the charges can be efficiently used to generate the high voltage of 3·VCC.

Seventh Embodiment

Figure 16:
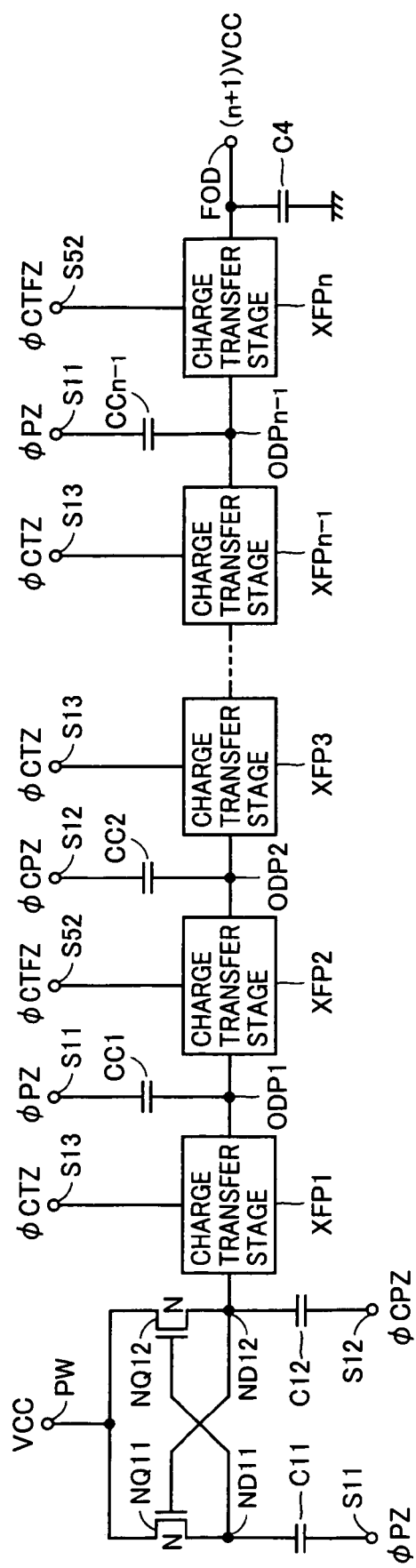
FIG. 16 shows a structure of a voltage generating circuit according to a seventh embodiment of the invention.

FIG. 16 schematically shows a construction of a voltage generating circuit according to a seventh embodiment of the invention. In FIG. 16, charge transfer stages XFP1–XFPn are cascaded between internal node ND12 and final output node FOD. Each of charge transfer stages XFP1–XFPn is the same in configuration as charge transfer stage XFP shown in FIG. 14.

Capacitance elements CC1 to CCn−1 are arranged corresponding to input nodes ODP1–ODPn−1 of charge transfer stages XFP2–XFPn, respectively. Capacitance elements CC1 to CCn−1 are alternately supplied with control signals φPZ and φCPZ through control signal input nodes S11 and S12. Charge transfer stages XFP1–XFPn are alternately supplied with control signals φCTZ and φCTFZ through control signal input nodes S13 and S52. Thus, charge transfer stages XFP1, XFP3, ... and XFPn−1 in odd-numbered stages are supplied with control signal φCTZ through control signal input nodes S13 to transfer the charges, and charge transfer stages XFP2, ... and XFPn in even-numbered stages are supplied with control signal φCTFZ through control signal input nodes S52 and has the charge transfer controlled.

Each of charge transfer stages XFP1–XFPn raises the received voltage by power supply voltage VCC. Therefore, a voltage of (n+1)·VCC is produced on final output node FOD.

For controlling the operation of accumulating the charges on node ND12, cross-coupled N-channel MOS transistors NQ11 and NQ12 are arranged, and capacitance elements C11 and C12 performing the charge pump operation on nodes ND11 and ND 12 in accordance with control signal φPZ and φCPZ are arranged. The circuit portion performing the charge pump operation on node ND12 is the same in configuration as that shown in FIGS. 3 and 14, and therefore the voltage on node ND12 changes between voltage VCC and the high voltage of 2·VCC.

Figure 17:
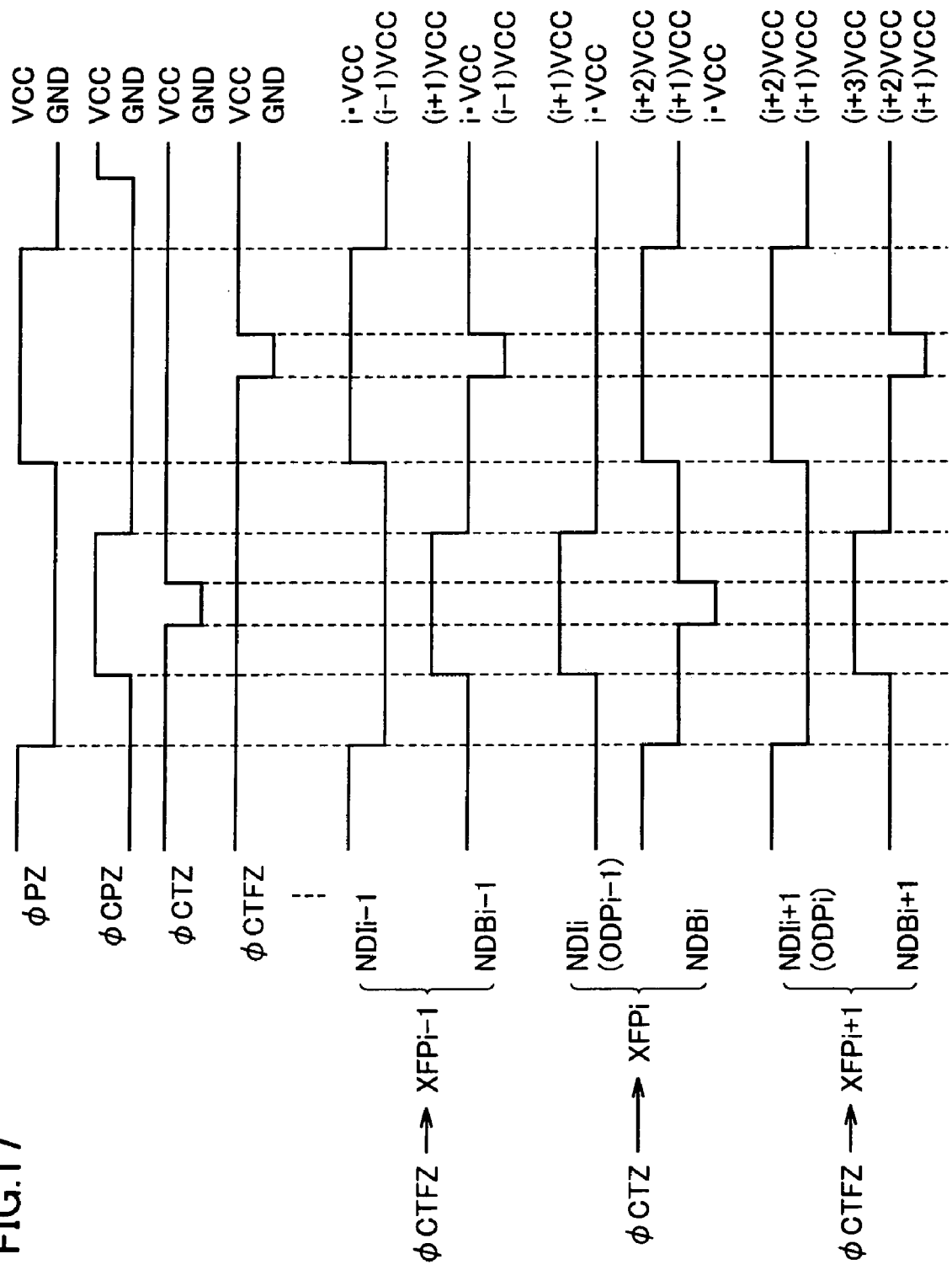
FIG. 17 is a signal waveform diagram illustrating an operation of the circuit shown in FIG. 16.

FIG. 17 is a timing chart illustrating an operation of the voltage generating circuit shown in FIG. 16 in the stable state. Referring to FIGS. 17 and 14, description will now be given on the operation of the voltage generating circuit shown in FIG. 16 in the stable state.

FIG. 17 illustrates waveforms of voltages on the input and internal nodes of charge transfer stages XFPi−1, XFPi and XFPi+1. Charge transfer stages XFPi−1 and XFPi+1 are supplied with control signal φCTF, and charge transfer stage YFPi is supplied with control signal φCT. Input node NDIj of charge transfer stage XFPj is connected to internal output node ODPj−1 of charge transfer stage XFPj−1 at the preceding stage. FIG. 17 illustrates internal output nodes ODIi−1 and ODIi corresponding to input nodes NDIi and NDIi+1, respectively. The potentials of the input nodes of the respective charge transfer stages will now be described due to the reference to FIG. 14.

When control signal φPZ falls to the level of ground voltage GND, input node NDIi−1 of charge transfer stage XFPi−1 lowers from a voltage level of i·VCC to a voltage level of (i−1)·VCC. In charge transfer stage XFPi+1, the voltage of its input node NDIi+1 lowers from the voltage level of (i+1)·VCC to the voltage level of (i+1)·VCC. In these charge transfer stages XFPi−1 and XFPi+1, since MOS transistor PQb is in an conductive state, internal nodes NDBi−1 and NDBi+1 are set to the voltage levels corresponding to the voltage levels of the subsequent charge transfer stages XFPi and XFPi+2, respectively.

When input node NDIi+1 of the charge transfer stage XFPi+1 subsequent to charge transfer stage XFPi lowers to the voltage level of (i+1)·VCC, the voltage level of output node NDBi of charge transfer stage XFPi lowers from (i+2)·VCC to (i+1)·VCC because MOS transistor PQd is conductive.

When control signal φCPZ rises from the level of ground voltage GND to the level of power supply voltage VCC, in charge transfer stage XFPi, the charge pumping by corresponding capacitance element CCi raises the voltage level of input node NDIi from the voltage of i·VCC to the voltage of (i+1)·VCC. Since MOS transistor PQb in charge transfer stage XFPi−1 is in a conductive state, such boosted voltage of node NDIi raises the voltage level of node NDBi−1 to (i+1)·VCC, and corresponding MOS transistor PQa is kept off.

Likewise, in charge transfer stage XFPi+1, the voltage level of internal node NDBi+1 rises to the voltage of (i+3)·VCC, and corresponding P-channel MOS transistor PQa is kept off.

When control signal φCTZ falls from power supply voltage VCC to ground voltage GND, in charge transfer stage XFPi, internal node NDBi attains the voltage level of i·VCC, MOS transistor PQa turns conductive to transmit the voltage of (i+1)·VCC on internal node ND1i to input node NDIi+1 at the subsequent or downstream charge transfer stage XFPi+1. In this charge transfer, backflow of charges is prevented in charge transfer stages XFPi−1 and XFPi+1 because MOS transistors PQa are in an off (non-conductive state).

When control signal φCPZ rises to the level of power supply voltage VCC, the voltage level of internal node NDBi in charge transfer stage XFPi rises from the voltage of i·VCC to the voltage of (i+1)·VCC, and the gate potential of corresponding P-channel MOS transistor PQa becomes equal to or higher than its source potential so that MOS transistor PQa is turned off.

When control signal φPZ rises from ground voltage GND to power supply voltage VCC, capacitance elements CCi−1 and CCi+1 in charge transfer stages XFPi−1 and XFPi+1 perform the charge pump operations to raise the voltage levels of the corresponding input nodes by power supply voltage VCC, respectively. Thus, input node NDIi−1 of charge transfer stage XFPi−1 attains the voltage level of i·VCC, and input node NDIi+1 of charge transfer stage XFPi+1 attains the voltage level of (i+2)·VCC.

In such state, in charge transfer stage XFPi, MOS transistor PQb turns conductive because the gate potential thereof is lower than the source potential thereof, and internal node NDBi rises to the level of the voltage of (i+2)·VCC equal to that of input node NDIi+1 of charge transfer stage XFPi+1, and MOS transistor PQa is kept off to prevent backflow of charges.

In this state, control signal φCTZF falls from power supply voltage VCC to ground voltage GND, and in charge transfer stages XFPi−1 and XFPi+1, the voltage levels of internal nodes NDBi−1 and NDBi+1 are lowered by power supply voltage VCC, and corresponding MOS transistors PQa are rendered conductive. Consequently, the charges are transferred from input node NDIi−1 to output node ODPi−1 (NDIi), and also the charges are supplied from input node NDIi+1 to the output node in charge transfer stage XFPi+1.

Subsequently, the above operations are repeated so that charge transfer stages XFP1–XFPn alternately perform the charge pump operation to boost the received voltages by the power supply voltage VCC, and can finally produce the voltage of (n+1)·VCC on final output node FOD.

In the high voltage generating circuit, in the transition period of the initial period of the charge pumping operation, as in the sixth embodiment, the threshold voltage of an MOS transistor is utilized to control the setting of the non-conductive state of the MOS transistor to prevent the occurrence of an ineffective current and each node is raised in voltage level gradually to attain the final stable voltage level.

In this seventh embodiment, control signals φPZ, φCPZ, φCTZ and φCTFZ each may be different in the high level voltage and the low level voltage from the others.

According to the seventh embodiment of the invention, as described above, a plurality of charge transfer stages are cascaded, the capacitance elements are used to perform the charge pump operation on the input nodes of the respective charge transfer stages, and the charge transfer operations are performed in an alternate manner. Accordingly, the internal voltage at an intended level can be produced with reduced current consumption.

Control signals φPZ, φCPZ, φCTZ and φCTFZ can be produced by inverting all the output signals of the control signal generating circuitry shown in FIG. 12.

Eighth Embodiment

Figure 18:
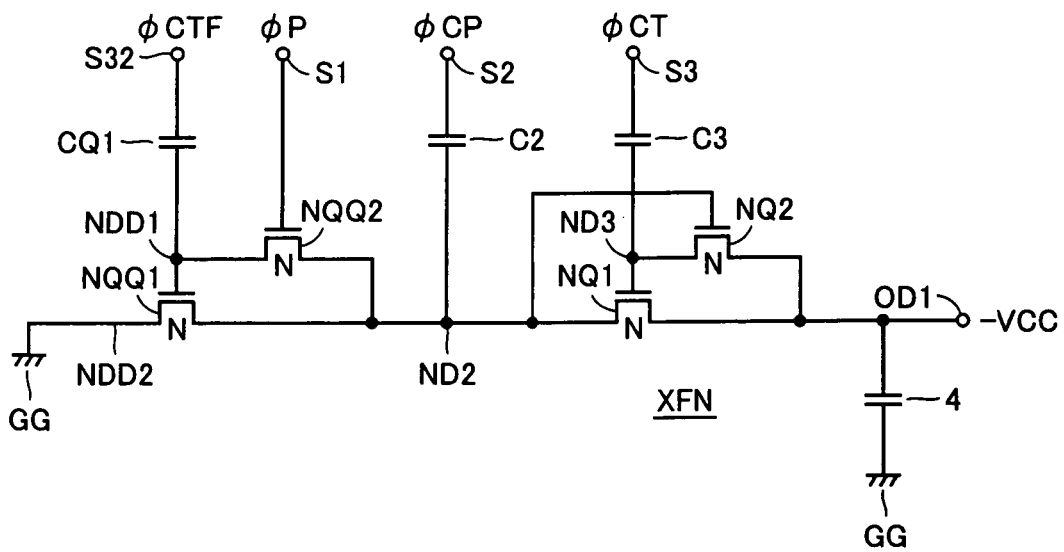
FIG. 18 shows a structure of a voltage generating circuit according to an eighth embodiment of the invention.

FIG. 18 shows a construction of a voltage generating circuit according to an eighth embodiment of the invention. The voltage generating circuit shown in FIG. 18 differs in configuration from the voltage generating circuit shown in FIG. 1 in the following points. Cross-coupled P-channel MOS transistors PQ1 and PQ2 in FIG. 1 are replaced with N-channel MOS transistors NQQ1 and NQQ2 forming a charge transfer stage. N-channel MOS transistor NQQ1 is connected between a precharge voltage supply node NDD2 and internal node ND2, and has a gate (control electrode) connected to an internal node (first internal node) NDD1. Precharge voltage supply node NDD2 is connected to ground node GG supplying ground voltage GND of the reference voltage.

N-channel MOS transistor NQQ2 is connected between internal nodes NDD1 and NDD2, and has a gate coupled to control signal input node S1 receiving control signal φP. Internal node NDD1 is coupled via capacitance element CQ1 to input node S32 receiving control signal φCTF.

The construction of the charge transfer stage arranged between input node ND2 and output node OD1 is the same as that shown in FIG. 1. Corresponding elements are allotted with the same reference numerals, and description thereof will not be repeated.

Control signals φCTF, φP, φCP and φCT each change between ground voltage GND and power supply voltage VCC, and are produced from the control circuit shown in FIG. 12.

MOS transistors NQQ1 and NQQ2 correspond to the claimed first and second transistors, respectively, and capacitance element CQ1 correspond to the claimed first capacitance element. Control signal φCTF corresponds to the first control signal, and control signal φP corresponds to the second control signal in the claim recitation. MOS transistors NQ1 and NQ2 correspond to the claimed third and fourth transistors, respectively, and capacitance elements C2 and C3 correspond to the claimed second and third capacitance elements, respectively. Control signals φCP and φCT correspond to the claimed third and fourth control signals, respectively. All the MOS transistors are each of the enhancement type.

Figure 19:
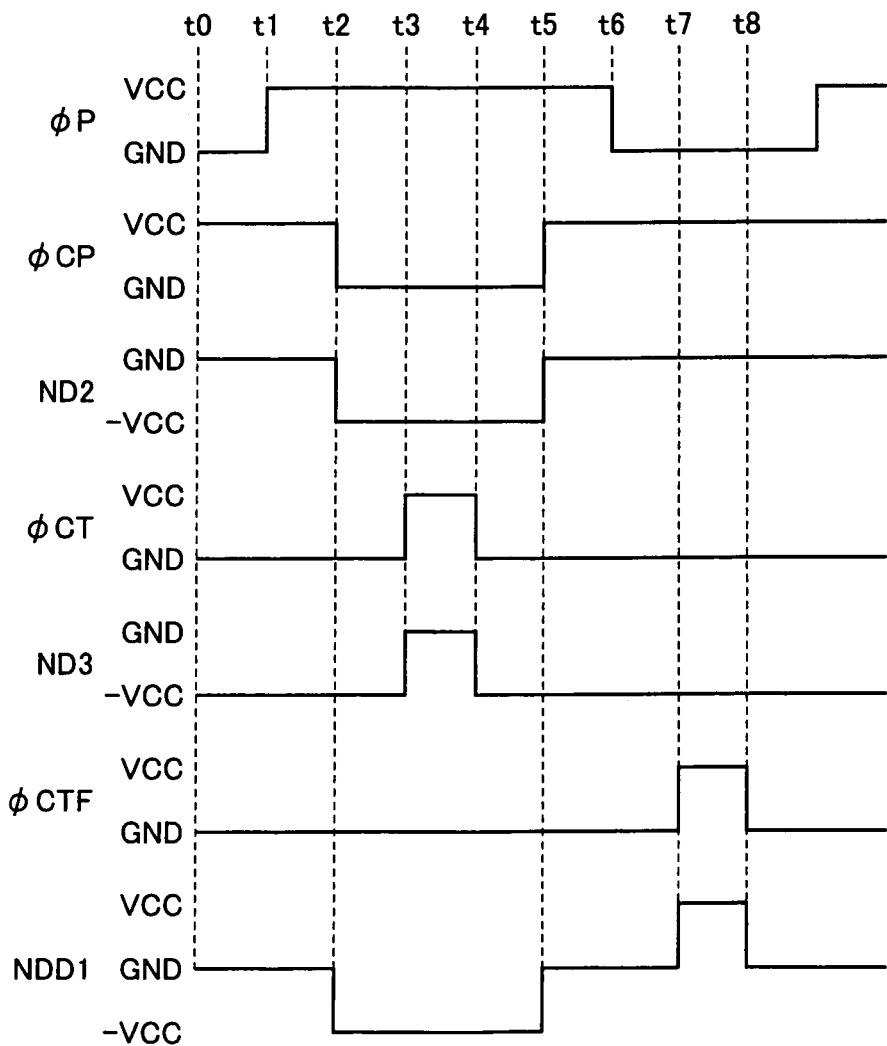
FIG. 19 is a timing chart illustrating an operation of the voltage generating circuit shown in FIG. 18.

FIG. 19 is a signal waveform diagram illustrating an operation of the voltage generating circuit shown in FIG. 18. Referring to FIG. 19, description will now be given on the operation of the voltage generating circuit shown in FIG. 18. FIG. 19 illustrates signal waveforms in the case when negative voltage −VCC is produced on output node OD1.

At time t0, control signals φP, φCT and φCTF are at the L level, and control signal φCP is at the H level. In this state, internal node ND2 is at the level of ground voltage GND through the charge pump operation of capacitance element C2 receiving control signal φCP. Internal node ND3 attains the level of negative voltage −VCC through the charge pump operation of capacitance element C3. In the stable state, when internal node ND2 is at the level of ground voltage GND, MOS transistor NQ2 is turned on (output node OD1 is at the level of negative voltage −VCC), and internal node ND3 is set to the same voltage level as that of output node OD1.

Internal node NDD1 is at the level of ground voltage GND through the charge pump operation of capacitance element CQ1. Control signal φP is at the L level of the ground voltage, and MOS transistor NQQ2 is in a non-conductive state.

At time t1, control signal φP rises to the H level of power supply voltage VCC. In response to this rising of control signal φP, MOS transistor NQQ2 is turned on, so that internal nodes NDD1 and ND2 are electrically coupled together, to attain the same voltage level (set to the ground voltage level).

At time t2, while control signal φP is at the H level, control signal φCP falls to the L level of ground voltage GND. In response to the falling of control signal φCP, the charge pumping by capacitance element C2 lowers the voltage level of node ND2. Since MOS transistor NQQ2 is in a conductive state, the charge pumping by capacitance element C2 lowers the voltage levels of nodes NDD1 and ND2 from the ground voltage to negative voltage −VCC. By making capacitance element C2 to have a capacitance value much larger than that of capacitance element CQ1, both internal nodes NDD1 and ND2 can be lowered from the level of ground voltage GND to the level of negative voltage −VCC.

When the voltage level of internal node ND2 lowers to the level of negative voltage −VCC, MOS transistor NQ2 in the output charge transfer stage turns off, so that internal node ND3 is isolated from output node OD1, and enters into an electrically floating state.

In this state, control signal φCT is raised from the level of ground voltage GND to the level of power supply voltage VCC at time t3. In response to the rising of control signal φCT, the charge pumping by capacitance element C3 raises the voltage level of node ND3 from negative voltage −VCC to the level of ground voltage GND, and MOS transistor NQ1 is turned on to couple electrically internal node ND2 to output node OD1. When output node OD1 is at a higher voltage level than internal node ND2, positive charges move from output node OD1 to internal node ND2 so that the voltage level of output node OD1 lowers.

Internal node ND3 is at the level of ground voltage GND. In the steady state, the gate-source voltage of MOS transistor NQ1 is equal to power supply voltage VCC, and the charges can be transferred between internal node ND2 and output node OD1 without an influence by the threshold voltage of MOS transistor NQ1.

When MOS transistor NQ1 is turned on to move the charges between internal node ND2 and output node OD1, the gate and source of MOS transistor NQ2 attain the same potential level. In this state, MOS transistor NQ2 is of the enhancement type, and maintains the non-conductive state due to its threshold voltage.

At time t4, control signal φCT falls from the H level to the L level. Responsively, the charge pumping by capacitance element C3 lowers the voltage level of internal node ND3 to negative voltage −VCC again, and MOS transistor NQ1 turns non-conductive.

When the charges move between internal node ND2 and output node OD1, MOS transistor NQQ2 is in a conductive state to couple electrically internal nodes NDD1 and ND2, and can supply negative charges from internal node ND2 to internal node NDD1 so that the charges can be efficiently transferred. In the above operation, MOS transistor NQQ1 maintains the non-conductive state because internal nodes NDD1 and ND2 are at substantially equal potentials, and the gate-source voltage thereof is lower than the threshold voltage.

At time t5, control signal φCP is raised from the L level of ground voltage GND to the H level of power supply voltage VCC. In response to the rising of control signal φCP, the charge pumping by capacitance element C2 raises the potential of internal node ND2 from the level of negative voltage −VCC. In this state, control signal φP is at the level of power supply voltage VCC, and MOS transistor NQQ2 is in a conductive state, so that the voltage levels of both internal nodes NDD1 and ND2 rise to ground voltage GND.

At time t6, control signal φP falls to the L level, and MOS transistor NQQ2 is turned off, and internal nodes ND2 and NDD1 are electrically isolated from each other.

At time t7, control signal φCTF rises to the H level. Thereby, the charge pump operation of capacitance element CQ1 raises the voltage level of internal node NDD1 from ground voltage GND to power supply voltage VCC (MOS transistor NQQ2 is off). In accordance with this rising of the potential level of internal node NDD1, MOS transistor NQQ1 is turned on to precharge internal node ND2 to the level of ground voltage GND.

At time t8, control signal φCTF falls to the L level. Responsively, the charge pumping by capacitance element CC1 lowers the potential of internal node NDD1 to the level of ground voltage GND again, and MOS transistor NQQ1 is turned off (node ND2 is at the ground voltage level).

Subsequently, the operations performed from time t0 to time t8 are repeated so that negative voltage −VCC corresponding to the potential amplitude of internal node ND2 is produced on output node OD1. A stabilizing capacitance element 4 stably maintains negative voltage −VCC on output node OD1.

In the transition period before the voltage level of output node OD1 becomes stable, node NDD1 attains the level of power supply voltage VCC in accordance with the H level of control signal φCTF in the period between times t7 and t8, to turn MOS transistor NQ1 conductive, so that internal node ND2 is coupled to the ground node to be set to the ground voltage level. After MOS transistor NQQ1 is turned off, control signal φCP is lowered from the H level to the L level. According to such control procedure, internal node ND2 attains the level of negative voltage −VCC, and positive charges flow from output node OD1 into internal node ND2 (negative charges flow from internal node ND2 into output node OD1) when MOS transistor NQ1 is conductive, and the voltage level of output node OD1 gradually lowers.

Even when the charges moves in the transition state, internal node ND2 is at the level of negative voltage −VCC, and MOS transistor NQ2 has the gate potential not exceeding the source and drain potentials, and maintains the non-conductive state. In this state, MOS transistor NQ1 can be kept conductive in accordance with control signal φCT. In the transition period, therefore, the negative charges can be reliably supplied to output node OD1 to lower its potential level gradually.

In the construction of the voltage generating circuit shown in FIG. 18, only N-channel MOS transistors are employed. Therefore, it is not necessary to provide a region for isolating a P-channel MOS transistor from an N-channel MOS transistor, and the circuit occupation area can be reduced. Further, steps for forming the P-channel MOS transistor are not necessary so that the number of manufacturing steps and the manufacturing cost can be reduced.

The gate potentials of MOS transistors NQ1, NQ2, NQQ1 and NQQ2 are individually controlled by control signals φCT, φCP, φCTF and φP, respectively. Therefore, by appropriately setting the timing of these control signals, the charges can be transferred after cutting off a path of flow of ineffective charges, and the flow of ineffective charges can be prevented so that the negative charges can be efficiently transferred to output node OD1 to produce negative voltage −VCC.

Similarly to the construction of the first embodiment shown in FIG. 1, the construction shown in FIG. 18 can set the voltage level produced from output node OD1 at any intended level by appropriately setting the amplitudes of control signals φCT, φCP, φP and φCTF, and the level of voltage applied to a ground node OGG serving as the precharge voltage supply node coupled to MOS transistor NQQ1.

According to the eighth embodiment of the invention, as described above, the charge transfer stages are cascaded, these charge transfer stages alternately perform the charge transfer, and the precharging and the charge accumulation are alternately performed on the internal nodes connected to these charge transfer stages. Thus, the charges can be efficiently utilized to produce the negative voltage at an intended voltage level. Further, the circuits are formed of the MOS transistors of the same conductivity type, and therefore a region for isolating the PMOS and NMOS transistors from each other is not required. In addition, the number of manufacturing steps can be reduced, and therefore, the manufacturing cost can be reduced.

Ninth Embodiment

Figure 20:
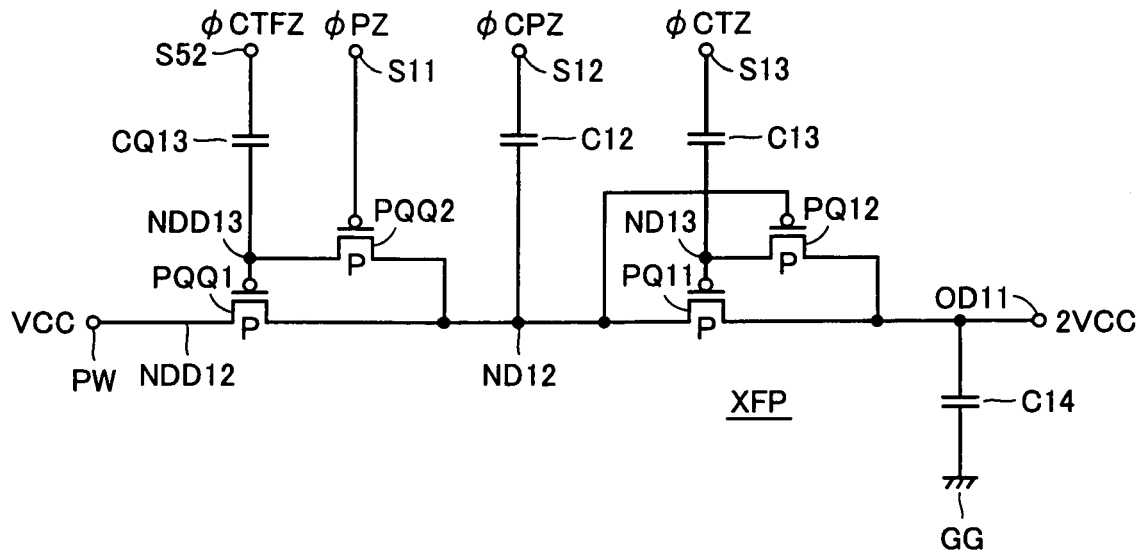
FIG. 20 shows a structure of a voltage generating circuit according to a ninth embodiment of the invention.

FIG. 20 shows a construction of a voltage generating circuit according to a ninth embodiment of the invention. The voltage generating circuit shown in FIG. 20 differs in construction from the voltage generating circuit shown in FIG. 3 in the following points. Cross-coupled N-channel MOS transistors NQ11 and NQ12 shown in FIG. 3 are replaced with P-channel MOS transistors PQQ1 and PQQ2. P-channel MOS transistor PQQ1 is connected between a precharge voltage supply node NDD12 and internal node ND12, and has a gate connected to an internal node NDD13.

Precharge voltage supply node NDD12 is connected to power supply node PW supplying power supply voltage VCC, and supplies charges for precharging internal node ND12 to the level of power supply voltage VCC. Internal node NDD13 is coupled via a capacitance element CQ13 to input node S52 receiving control signal φCTFZ. The high voltage 2 VCC (equal to 2 VCC) is produced on output node OD11.

P-channel MOS transistor PQQ2 is connected between internal nodes ND12 and NDD13, and has a gate connected to input node S11 receiving control signal φPZ.

A charge transfer stage transferring charges between internal node ND12 and output node OD11 has the same construction as that shown in FIG. 3. Corresponding elements are allotted with the same reference numerals, and description thereof will not be repeated.

Internal node ND12 is coupled to input node S12 receiving control signal φCPZ via capacitance element C12.

These control signals φPZ, φCPZ, φCTZ and φCTFZ are produced by inverting control signals φP, φCP, φCT and φCTF generated from the control signal generating circuits.

In the structure shown in FIG. 20, for correlation with the claimed elements, MOS transistors PQQ1 and PQQ2 correspond to the first and second transistors, and MOS transistors PQ11 and PQ12 correspond to the third and fourth transistors, respectively. Control signals φCTFZ, φPZ, φCPZ and φCTZ correspond to the first, second, third and fourth control signals, respectively. Capacitance elements CQ13, C12 and C13 correspond to the first, second and third capacitance elements, respectively.

Figure 21:
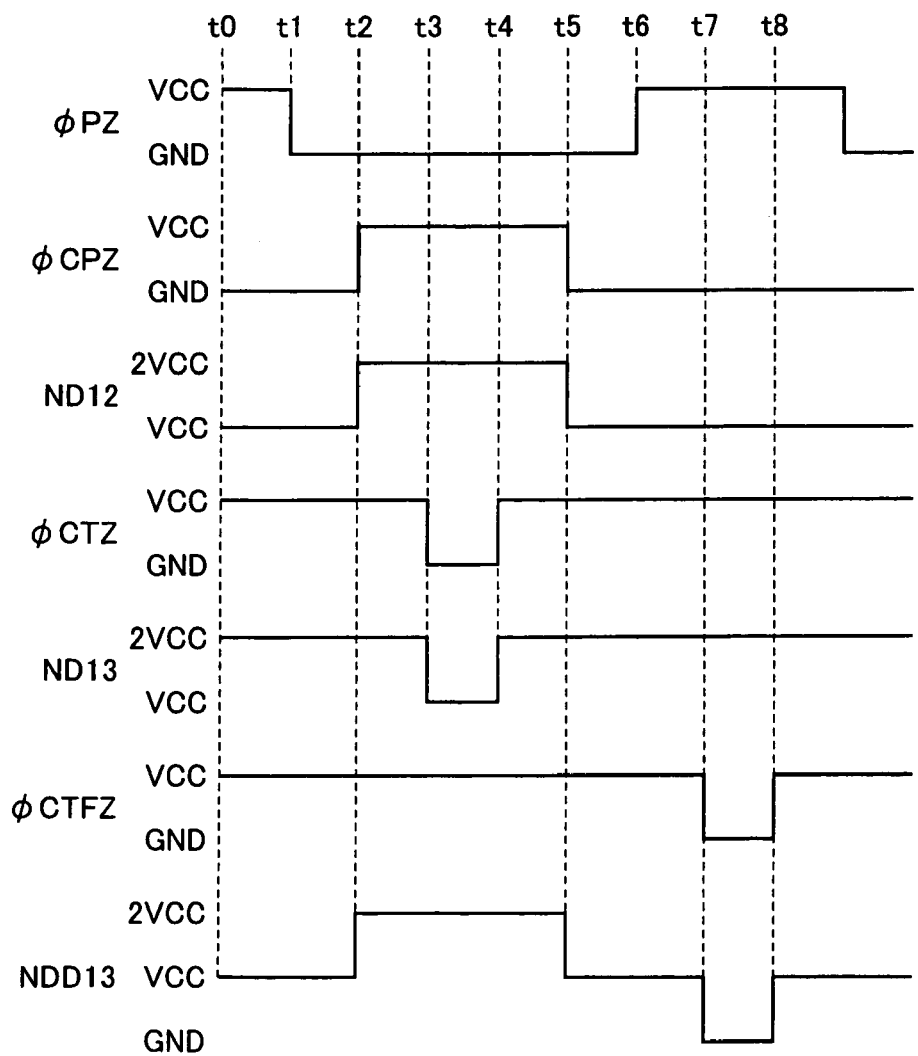
FIG. 21 is a timing chart representing an operation of the voltage generating circuit shown in FIG. 20.

FIG. 21 is a signal waveform diagram illustrating an operation of the voltage generating circuit shown in FIG. 20. The voltage generating circuit shown in FIG. 20 generates a voltage of 2·VCC on output node OD11 on the basis of the voltage VCC applied to power supply node PW. Accordingly, the operation waveforms of the voltage generating circuit shown in FIG. 20 can be obtained by inverting voltage polarities of the signals and nodes of the voltage generating circuit shown in FIG. 18, and measuring the voltages on the respective nodes with reference to power supply voltage VCC. Therefore, the operation of the voltage generating circuit shown in FIG. 20 will now be described briefly with reference to FIG. 21.

At time t0, control signals φPZ, φCTZ and φCTFZ are at the H level of power supply voltage VCC, and control signal φCPZ is at the L level of ground voltage GND. In this state, node ND12 is at the level of power supply voltage VCC, and node ND13 is at the level of power supply voltage VCC. MOS transistor PQQ2 is in a non-conductive state, and MOS transistor PQQ1 is also in a non-conductive state. Through the charge pump operation of capacitance element C13, node ND13 is at the level of high voltage 2VCC, similarly to the second embodiment, and MOS transistor PQ11 is in an off state (non-conductive state). MOS transistor PQ12 is an on state (conductive state), and internal node ND13 is electrically coupled to output node OD1.

At time t1, control signal φPZ falls from the H level of power supply voltage VCC to the L level of ground voltage GND, and MOS transistor PQQ2 turns conductive to couple electrically internal node NDD13 to internal node ND12. MOS transistor PQQ1 maintains the non-conductive state because the gate, source and drain potentials thereof are equal to each other.

At time t2, control signal φCPZ rises from the L level to the H level. In response to the rising of control signal φCPZ, the charge pumping by capacitance element C12 raises the voltage level of node ND12 from power supply voltage VCC to high voltage 2 VCC by an amplitude VCC of control signal φCPZ. In this operation, MOS transistor PQQ2 is conductive so that the voltage level of node NDD13 rises to high voltage 2 VCC. With capacitance element C12 much larger in capacitance value than capacitance element CQ13, node NDD13 can be charged to the level of high voltage 2VCC, similarly to the charging operation of node NDD12. In accordance with the rising of the potential level of node NDD13, MOS transistor PQQ1 turns non-conductive.

In accordance with the rising of the potential level of internal node ND12, MOS transistor PQ12 turns non-conductive (output node OD11 is at the potential level of voltage 2 VCC), and internal node ND13 is isolated from output node OD11.

At time t3, control signal φCTZ falls from the H level to the L level, and the charge pumping by capacitance element C13 lowers the potential level of internal node ND13 from the high voltage 2 VCC to power supply voltage VCC. When the potential of internal node ND13 lowers to the level of power supply voltage VCC, MOS transistor PQ11 turns conductive to transfer the charges between internal node ND12 and output node OD11. Since the absolute value of threshold voltage of MOS transistor PQ11 is much smaller than power supply voltage VCC, the charges can be transferred between internal node ND12 and output node OD11 without an influence of the threshold voltage of MOS transistor PQ11. When the voltage level of output node OD11 is lower than the voltage of 2·VCC, positive charges are supplied from internal node ND12 to output node OD11, and the voltage level of output node OD11 rises.

At time t4, control signal φCTZ rises from the L level to the H level, and the charge pumping by capacitance element C13 raises the potential level of internal node ND13 to the high voltage 2 VCC again. Accordingly, MOS transistor PQ11 turns non-conductive, and the charge transfer operation completes. In this state, the potential level of internal node ND12 is lower than the potential level of internal node ND13, and the positive charges move from internal node ND13 to output node OD11 via MOS transistor PQ12 even when MOS transistor PQ12 is in a conductive state. Responsively, the voltage level of output node OD11 rises so that the flow-out charges are effectively utilized, and no ineffective current flows. This is the same as in the second embodiment.

At time t5, control signal φCPZ falls from the H level to the L level, and responsively the charge pumping by capacitance element C12 lowers the voltage level of internal node ND12 from high voltage 2 VCC to power supply voltage VCC. When internal node ND12 attains the level of power supply voltage VCC, MOS transistor PQ12 is turned on to make node ND13 and output node OD11 equal in potential to each other, and accordingly MOS transistor PQ11 is turned off, and internal node ND13 is isolated from output node OD11 (in the case where the voltage level of output node OD11 is higher than power supply voltage VCC).

Since MOS transistor PQQ2 is conductive, the voltage level of internal node NDD13 lowers from the positive high voltage 2 VCC to power supply voltage VCC in accordance with the potential change on internal node ND12. In this state, MOS transistor PQQ1 of the enhancement type has the gate and source set at equal potential, and maintains the non-conductive state so that no charges flow from internal node ND12 to power supply node PW.

At time t6, control signal φPZ rises from the L level to the H level. Responsively, MOS transistor PQQ2 has the gate and source set to the potential equal to each other, and turns non-conductive to isolate electrically internal node NDD13 from internal node ND12.

At time t7, control signal φCTFZ lowers from the H level to the L level. Responsively, the charge pumping by capacitance element CQ13 lowers the voltage level of internal node NDD13 from power supply voltage VCC to ground voltage GND, and MOS transistor PQQ1 turns conductive to couple internal node ND12 to power supply node PW, and internal node ND12 is precharged to the level of power supply voltage VCC.

At time t8, control signal φCTFZ rises from the L level to the H level again, and the charge pump operation of capacitance element CQ13 changes the voltage level of internal node NDD13 to power supply voltage VCC again. Responsively, MOS transistor PQQ1 is turned off, and the precharging operation of internal node ND12 completes.

Subsequently, the operations from time t0 to time t8 are repeated so that high voltage 2 VCC can be produced on output node OD11.

In the transition period before the voltage on output node OD11 reaches high voltage 2 VCC, control signal φCTFZ lowers to the L level of ground voltage GND in a period between times t7 and t8, and responsively MOS transistor PQQ1 is turned on to precharge internal node ND12 to the level of power supply voltage VCC. When the voltage level of output node OD11 is lower than power supply voltage VCC, MOS transistor PQ12 is reliably maintained non-conductive. When control signal φCPZ rises to the level of power supply voltage VCC, internal node ND12 attains the level of high voltage 2 VCC. Responsively, MOS transistor PQQ1 turns non-conductive, and the flow of current from internal node ND12 to power supply node PW is suppressed. In addition, MOS transistor PQ12 has the gate potential higher than its source and drain potentials, and is reliably turned off.

When control signal φCTZ is at the L level, internal node ND13 lowers to or below the level of power supply voltage VCC in a transition period, and MOS transistor PQ11 has the gate potential lower than its source potential, and is turned on. Therefore, the positive charges can be supplied from internal node ND12 to output node OD11, and the voltage level of output node OD11 rises.

In this transition state, the voltage level of node ND13 changes between power supply voltage VCC and high voltage 2 VCC. Before the voltage on output node OD11 lowers to or below power supply voltage VCC, MOS transistor PQ12 maintains the non-conductive state. In this state, the voltage level of internal node ND13 changes between power supply voltage VCC and ground voltage GND, and MOS transistor PQ11 is turned on when internal node ND13 is set to the ground voltage level in accordance with control signal φCPZ. Consequently, the positive charges are supplied to output node OD1 to raise its voltage level.

When MOS transistor PQ12 starts to be conductive in accordance with rising of the voltage level of output node OD11 to or above power supply voltage VCC, the voltage level of internal node ND13 rises similarly to the voltage level of output node OD11, and the voltage level of internal node ND13 rises in accordance with the voltage level of output node OD11. In this case, the charges flowing from output node OD11 to internal node ND13 are utilized to raise the potential level of internal node ND13, for setting the MOS transistors PQ12 and PQ11 to the conductive/non-conductive states in accordance with control signals φCTZ and φCPZ. Therefore, no ineffective current flows.

Similarly to the eighth embodiment, the voltage generating circuit shown in FIG. 20 can efficiently transfer the charges without causing any ineffective current, and thereby can produce high voltage 2 VCC on output node OD11.

In the voltage generating circuit shown in FIG. 20, only the P-channel MOS transistors are employed. Similarly to the eighth embodiment, therefore, it is not necessary to manufacture both the P- and N-channel MOS transistors, so that the area occupied by the circuitry and the number of manufacturing steps can be reduced, and accordingly, the manufacturing cost can be reduced.

In the ninth embodiment, control signals φPZ, φCPZ, φCTZ and φCTFZ have the amplitudes of power supply voltage VCC, and a high voltage 2 VCC higher by this amplitude than the reference voltage being power supply voltage VCC. However, the voltage applied to the power supply node (precharge voltage supply node) may be at the level different from power supply voltage VCC, and control signals φPZ, φCPZ, φCTZ and φCTFZ may have the amplitudes different from power supply voltage VCC. In this case, the voltage supplied to the reference precharge voltage supply node (power supply node PW) can be used as a reference voltage, and a high voltage higher by the amplitude of control signal φCPZ can be produced on output node OD11 on the basis of such reference voltage.

According to the ninth embodiment, as described above, the PMOS transistor is utilized to accumulate and transfer the charges by controlling the gate voltage, and the positive high voltage at an intended level can be produced without causing an ineffective current.

Tenth Embodiment

Figure 22:
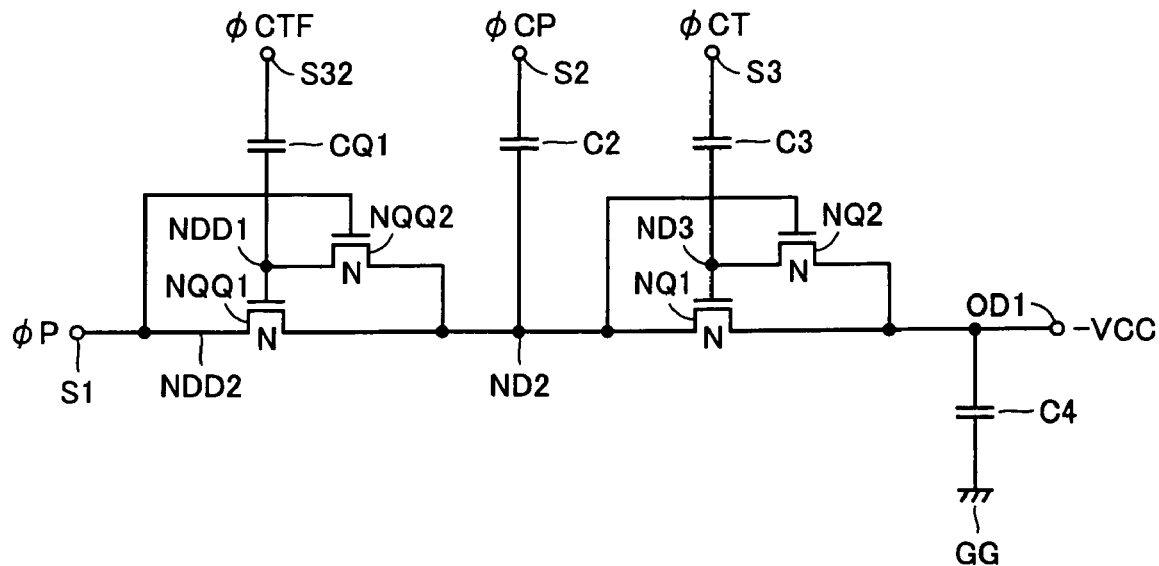
FIGS. 22, 23 and 24 show constructions of voltage generating circuits according to tenth, eleventh and twelfth embodiments of the invention, respectively.

FIG. 22 shows a structure of a voltage generating circuit according to a tenth embodiment of the invention. In the voltage generating circuit shown in FIG. 22, precharge voltage supply node NDD2 is coupled to input node S1 receiving control signal φP. Other construction of the voltage generating circuit shown in FIG. 22 is the same as that of the voltage generating circuit shown in FIG. 18. Corresponding portions are allotted with the same reference numerals, and description thereof will not be repeated.

MOS transistor NQQ1 is provided for reliably precharging internal node ND2 to the level of ground voltage GND in accordance with control signal φCTF. When control signal φCTF attains the H level of power supply voltage VCC, control signal φP is at the L level of ground voltage GND (FIG. 19). Therefore, when MOS transistor NQQ1 is conductive, internal node ND2 can be precharged to the ground voltage level in accordance with control signal φP.

When control signal φP is at the H level of power supply voltage VCC, control signal φCTF is at the L level of ground voltage GND. In this state, MOS transistor NQQ2 is in a conductive state to electrically couple internal nodes NDD1 and ND2. Accordingly, MOS transistor NQQ1 have the gate and source made equal in potential to each other, and maintains the non-conductive state. Therefore, such a situation can be reliably prevented that a current flows from control signal input node S I to internal node ND2 when the potential level of internal node ND2 lowers.

Operation waveforms of the voltage generating circuit shown in FIG. 22 are the same as those in FIG. 19 for the voltage generating circuit shown in FIG. 18. It is not necessary to use ground voltage GND for generating negative voltage –VCC, and the circuit configuration and layout can be made simple. Stabilizing capacitance 4 merely has the other electrode coupled to ground node GG, and therefore can be arranged in any position. Accordingly, the voltage generating circuit is not subject to restriction by the interconnection layout of the power supply line and ground line, and the restrictions on the circuit arrangement positions are mitigated, which improves the freedom degree in arrangement position of the voltage generating circuit in the semiconductor device incorporating the voltage generating circuit.

Eleventh Embodiment

Figure 23:
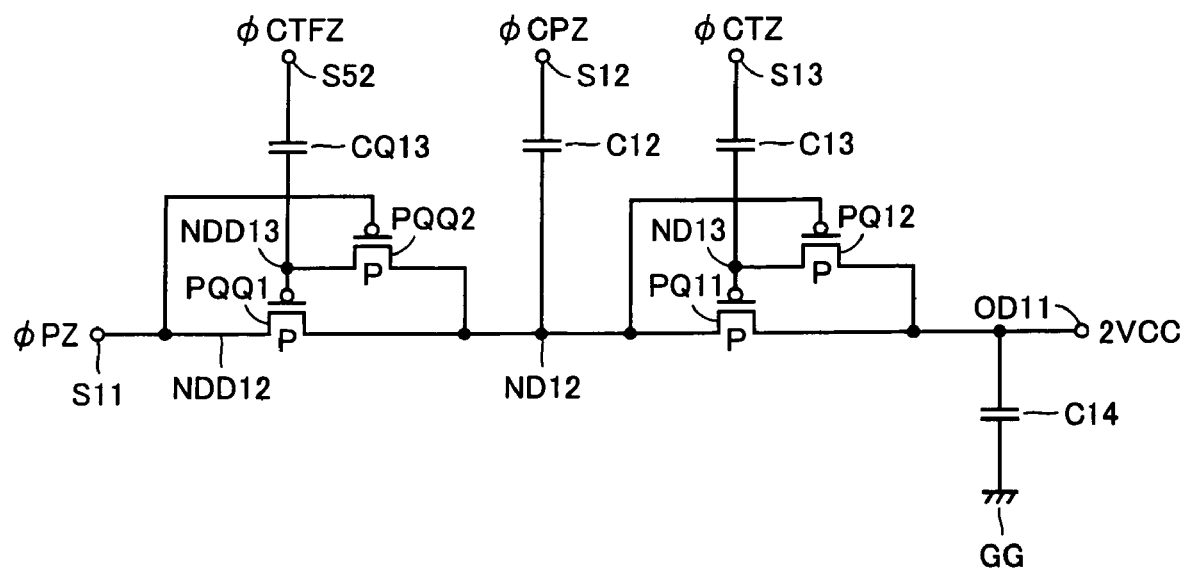

FIG. 23 shows a structure of a voltage generating circuit according to an eleventh embodiment of the invention. The voltage generating circuit shown in FIG. 23 differs in configuration from the voltage generating circuit shown in FIG. 20 in the following points. Specifically, precharge voltage supply node NDD12 coupled to P-channel MOS transistor PQQ1 is coupled to control signal input node S11 receiving control signal φPZ. Other configuration of the voltage generating circuit shown in FIG. 23 is the same as in the voltage generating circuit shown in FIG. 20. Corresponding portions are allotted with the same reference numerals, and description thereof will not be repeated.

MOS transistor PQQ1 is provided for precharging internal node ND12 to the level of power supply voltage VCC. Control signal φPZ is at the H level of power supply voltage VCC when control signal φCTZF turning on MOS transistor PQQ1 is at the L level. When MOS transistor PQQ1 is conductive, therefore, control signal φPZ can precharge internal node ND12 to the level of power supply voltage VCC. Accordingly, the operation waveforms of the voltage generating circuit shown in FIG. 23 are provided by the operation waveforms corresponding to those illustrated in FIG. 21, and the same operations as the voltage generating circuit shown in FIG. 20 can be implemented.

When control signal φPZ is at the L level, control signal φCTFZ is at the H level, and MOS transistor PQQ2 electrically couples internal nodes NDD13 and ND12. Therefore, MOS transistor PQQ1 has the equal potential at its gate and source (internal node 12), and therefore maintains the non-conductive state so that the flow of a current from internal node ND12 to input node S11 can be reliably suppressed.

By using the voltage generating circuit shown in FIG. 23, therefore, high positive voltage 2 VCC can be produced, similarly to the voltage generating circuit shown in FIG. 20.

The voltage generating circuit shown in FIG. 23 does not utilize power supply voltage VCC for producing high voltage 2 VCC. Therefore, the circuit configuration can be made simple, and the interconnection layout can also be made simple. Since the voltage generating circuit does not utilize the power supply voltage VCC, the voltage generating circuit can be arranged without a restriction by the interconnection layout of power supply voltage VCC (if it is arranged as an internal circuit of a semiconductor integrated circuit). This voltage generating circuit may be arranged in a structure such as a system LSI as a macro of one circuit block.

According to the eleventh embodiment of the invention, as described above, the control signals are utilized for precharging the internal node, and a power supply voltage is not required so that the circuit configuration can be made simple.

Twelfth Embodiment

Figure 24:
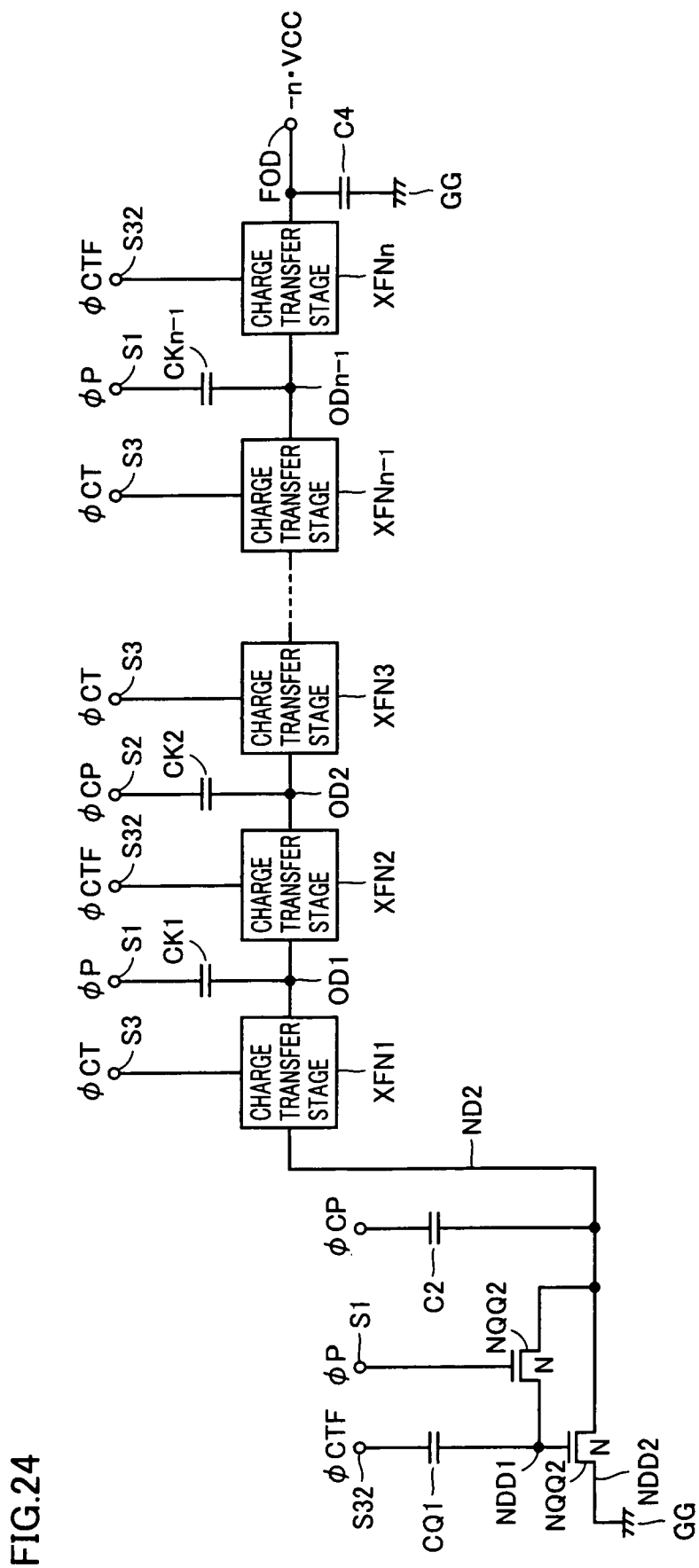

FIG. 24 shows a construction of a voltage generating circuit according to a twelfth embodiment of the invention. The voltage generating circuit shown in FIG. 24 differs in configuration from the voltage generating circuit shown in FIG. 10A in the following points. The negative charge producing stage is not formed of cross-coupled P-channel MOS transistors PQ1 and PQ2 in FIG. 10A, but is formed of MOS transistors NQQ1 and NQQ2 as well as capacitance elements CQ1 and CQ2 shown in FIG. 18.

Between internal node ND2 and final output node FOD, a plurality of charge transfer stages XFN1–XFNn are connected in series, similarly to the construction shown in FIG. 10A. The construction arranged between internal node ND2 and final output node FOD is the same as that shown in FIG. 10A. Corresponding portions are allotted with the same reference numerals, and description thereof will not be repeated. Each of charge transfer stages XFN1–XFNn has the same configuration as in charge transfer stage XFN shown in FIG. 10B.

In the voltage generating circuit shown in FIG. 24, the voltage level of internal node ND2 changes between ground voltage GND and negative voltage –VCC, and charge transfer stage XFN1 supplies negative charges to internal output node OD1 from internal node ND2. In the operation of transferring the negative charges from internal node ND2 to internal output node OD1, control signal φP is at the H level, and internal output node OD1 has been precharged to negative voltage –VCC (in the stable operation), so that internal output node OD1 is reliably set to the level of negative voltage –VCC in accordance with transfer control signal φCT. In the charge transfer operation, MOS transistor NQ2 is non-conductive, and internal node ND3 is set to the ground voltage level in response to control signal φCT, and accordingly, MOS transistor NQ1 turns conductive, so that the negative charges can be transferred between node ND2 and OD1.

When control signal φCP attains the H level, internal node ND2 attains the ground voltage level, and MOS transistor NQ2 is turned on to connect electrically internal output node OD1 to internal node ND3 so that MOS transistor NQ1 is reliably turned on.

When control signal φP falls from the H level to the L level, the voltage level of internal output node OD1 lowers from negative voltage −VCC to the negative voltage of −2·VCC. In this state, MOS transistor NQ2 is conductive, and MOS transistor NQ1 has the source and drain made equal in potential to each other, and maintains the non-conductive state. Therefore, backflow of the negative charges does not occur.

Similarly to the construction shown in FIG. 10A, the voltage drop equal to the amplitude of VCC of control signals φCP and φP is caused in each of charge transfer stages XFN2–XFNn. Therefore, the potential of output node ODn−1 of charge transfer stage XFNn−1 changes between the negative voltage of −(n−1)·VCC and the negative voltage of −n·VCC. Last charge transfer stage XFNn supplies the negative voltage to final output node FOD in accordance with control signal φCTF. Therefore, the negative voltage of −n·VCC is generated on final output node FOD similarly to the structure shown in FIG. 10A.

In the construction of the voltage generating circuit shown in FIG. 24, capacitance element C2 is provided for internal node ND2, and negative voltage of −n·VCC is produced on final output node FOD. By using this capacitance element C2, the negative potential of internal node ND2 is changed between ground voltage GND and negative voltage −VCC, and accordingly, charge transfer stage XFNI can reliably transfer negative voltage −VCC to internal output node OD1 when internal MOS transistor (NQ1) for charge transfer is turned on in response to control signal φCT. When internal node ND2 restores to the level of ground voltage GND, the charge transfer transistor (NQ1) can be made non-conductive in charge transfer stage XFN1. In charge transfer stage XFN1, therefore, the charge transfer operation can be controlled in accordance with control signal φCT, and therefore, the voltage drop by the amplitude of VCC can be caused in each of charge transfer stages XFN1–XFNn without causing an ineffective current flow.

The operation waveforms of the voltage generating circuit shown in FIG. 24 are represented by the signal waveforms illustrated in FIG. 11.

Accordingly, charge transfer stages XFN1–XFNn in the voltage generating circuit shown in FIG. 24 are each formed of N-channel MOS transistors, and the basic negative charge producing stage producing the basic negative charges on internal node ND2 is formed of N-channel MOS transistors NQQ1 and NQQ2. In this voltage generating circuit, therefore, each stage is formed of the N-channel MOS transistors, and the negative voltage of −n·VCC at an intended level can be produced with a small circuit occupation area and reduced current consumption.

Modification

Figure 25:
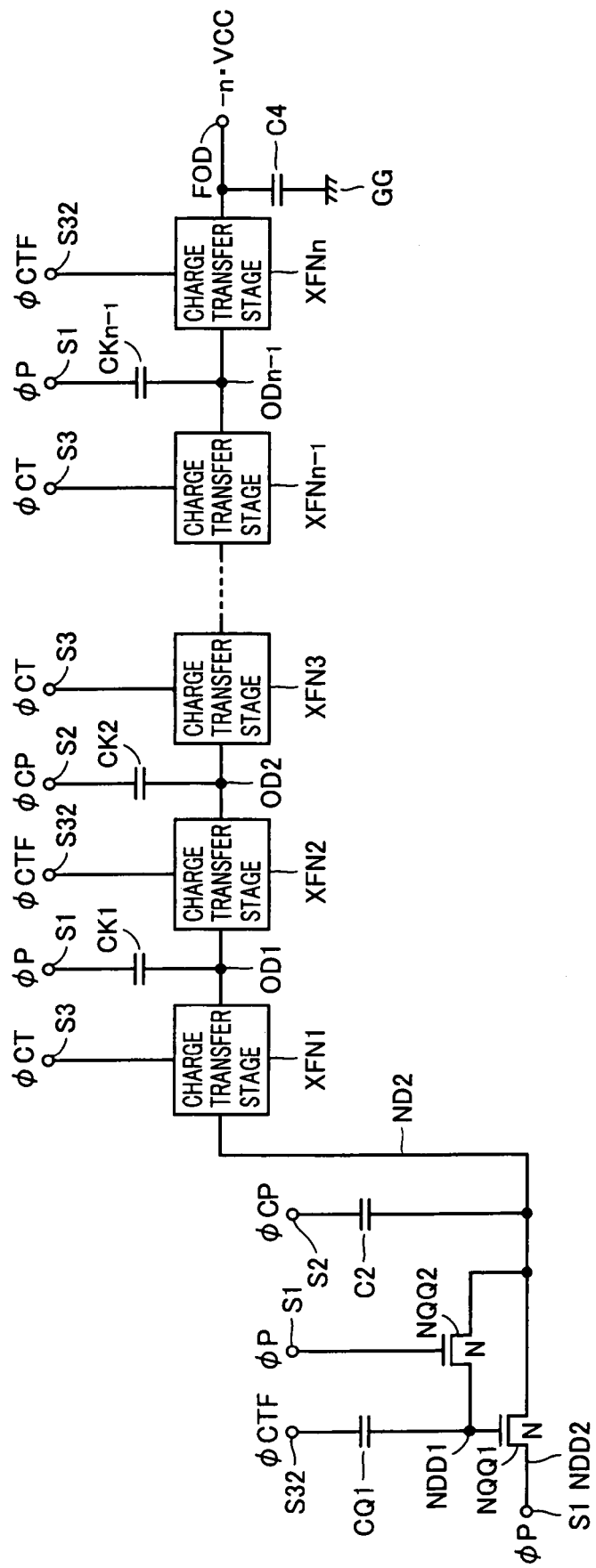
FIG. 25 shows a construction of a voltage generating circuit according to a modification of the twelfth embodiment of the invention.

FIG. 25 shows a construction of a voltage generating circuit of a modification of the twelfth embodiment of the invention. The voltage generating circuit shown in FIG. 25 differs in configuration from the voltage generating circuit shown in FIG. 24 in the following points. Precharge voltage supply node NDD2 of N-channel MOS transistor NQQ1 is connected to input node S1 receiving control signal φP. Other configuration of the voltage generating circuit shown in FIG. 25 is the same as that of the voltage generating circuit shown in FIG. 24. Corresponding portions are allotted with the same reference numerals, and description thereof will not be repeated.

In the construction of the voltage generating circuit shown in FIG. 25, the voltage level of internal node ND2 changes between ground voltage GND (corresponding to the L level of control signal φP) and negative voltage −VCC. Therefore, the negative voltage of −n·VCC is generated on final output node FOD.

The operation waveforms of the voltage generating circuit shown in FIG. 25 are represented by those illustrated in FIG. 11. In the voltage generating circuit shown in FIG. 25, ground voltage GND is not used for generating the negative voltage, so that the circuit configuration can be made simple as in the tenth embodiment, and thus, the manufacturing cost can be reduced.

According to the twelfth embodiment of the invention, as described above, a plurality of charge transfer stages are cascaded to produce the final negative voltage on the final output node, and the negative voltage at an intended voltage level can be easily produced. Since each charge transfer stage is formed of the N-channel MOS transistors, the circuit configuration can be made simple. Also, the circuit layout area can be reduced, and the manufacturing cost can be made low.

Thirteenth Embodiment

Figure 26:
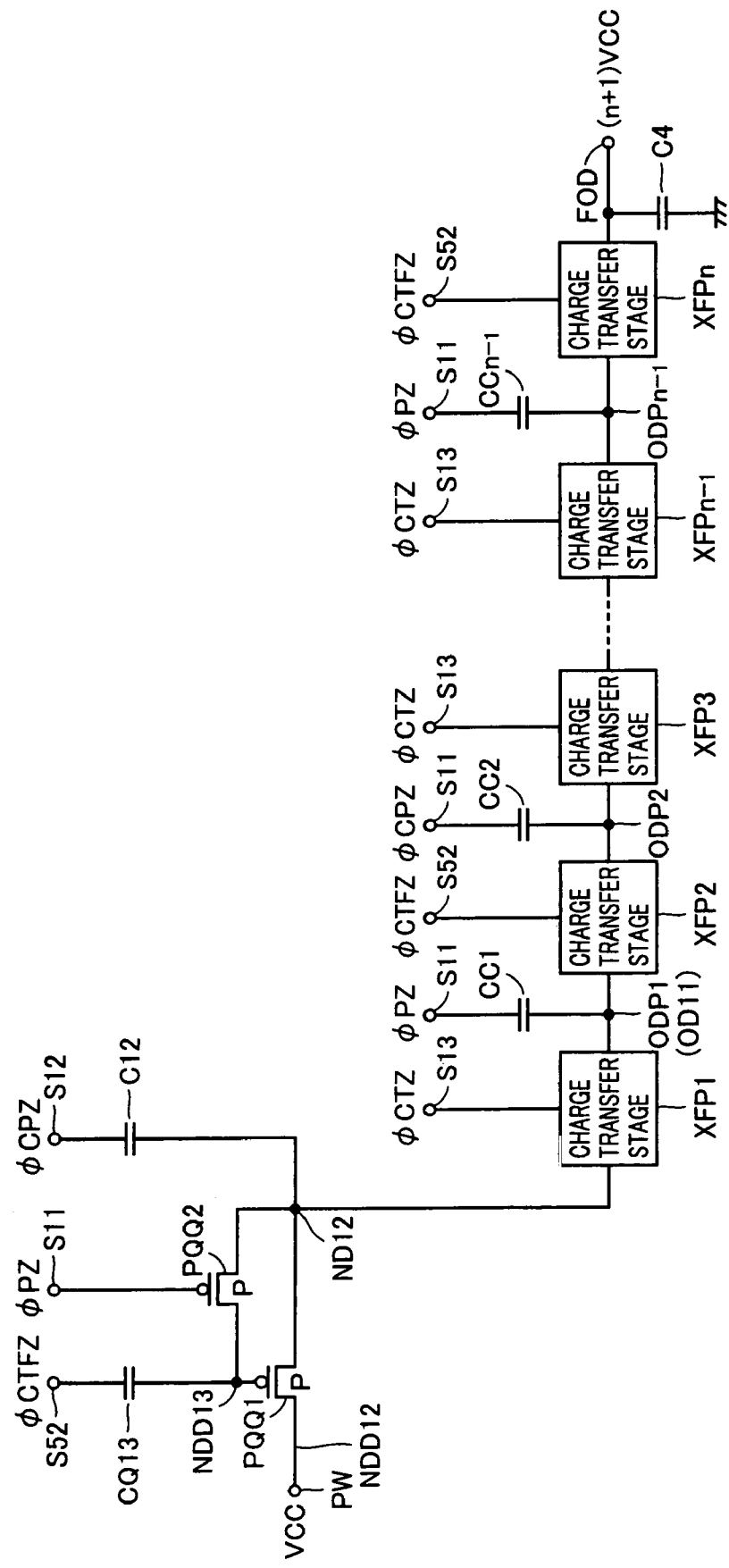
FIG. 26 shows a construction of a voltage generating circuit according to a thirteenth embodiment of the invention.

FIG. 26 shows a construction of a voltage generating circuit according to a thirteenth embodiment of the invention. The voltage generating circuit shown in FIG. 26 differs in configuration from the voltage generating circuit shown in FIG. 16 in the following points. For a circuit supplying the positive charges to internal node ND12, the voltage generating circuit shown in FIG. 26 employs P-channel MOS transistors PQQ1 and PQQ2 as well as capacitance elements CQ13 and C12, as in the construction shown in FIG. 20. Precharge voltage supply node NDD12 of MOS transistor PQQ1 is coupled to power supply node PW, and receives power supply voltage VCC. The circuit configuration for supplying the positive charges to internal node ND12 is the same as the configuration shown in FIG. 20. Corresponding portions are allotted with the same reference numerals, and description thereof will not be repeated.

Similarly to the construction of the voltage generating circuit shown in FIG. 6, charge transfer stages XFP1–XFPn of n stages are cascaded between internal node ND12 and final output node FOD. In addition, capacitance elements CC1–CCn−1 are connected to internal output nodes ODP1–ODPn−1 of charge transfer stages XFP1–XFPn−1, respectively. The connection and operation of these charge transfer stages XFP1–XFPn and capacitance elements CC1 to CCn−1 are the same as those of the voltage generating circuit shown in FIG. 18, and corresponding portions are allotted with the same reference numerals. Accordingly, charge transfer stages XFP1–XFPn alternately perform the precharging of the internal nodes and the charge transfer operation, and capacitance elements CC1 to CCn−1 alternately perform the precharging and the boosting of corresponding internal output nodes ODP1–ODPn−1.

Internal node ND12 changes in potential between power supply voltage VCC and high voltage 2 VCC, similarly to the construction of the voltage generating circuit shown in FIG. 20. After charge transfer stage XFPI transmits high voltage 2 VCC to internal output node ODP1 (OD11), capacitance element CC1 further raises the voltage level of internal output node ODP1 by voltage VCC in accordance with control signal φPZ. Therefore, charge transfer stages XFP1 to XFPn−1 produce on their respective output nodes the voltages boosted by the voltage VCC relative to the output node voltages in the preceding stages. The voltage level of output node ODPn−1 of charge transfer stage XFP(n−1) changes between the voltage of n·VCC and (n+1)·VCC. Therefore, charge transfer stage XFPn in the last stage produces the high voltage of (n+1)·VCC on final output node FOD.

The operation waveforms of voltage generating circuit shown in FIG. 26 are represented by those of the voltage generating circuit shown in FIG. 19, and the high voltage of (n+1)·VCC can likewise be produced from power supply voltage VCC.

By arranging the capacitance element C12 for internal node ND12, and changing the potential of internal node ND12 between power supply voltage VCC and high voltage 2 VCC, the following operation is reliably implemented in charge transfer stage XFP1. The MOS transistor for the transfer (MOS transistor PQ11) is maintained in a nonconductive state to prevent the backflow of positive charges when control signal ɸCPZ attains the H level. In addition, the positive charges can be transferred from node ND12 to internal output node ODP1 through charge transfer stage XFP1 in accordance with control signal ɸCTZ.

Charge transfer stages XFP1 to XFPn are each formed of the P-channel MOS transistors, and the stage for supplying positive charges to internal node ND12 is likewise formed of P-channel MOS transistors PQQ1 and PQQ2, or of the MOS transistors of the same conductivity type. Therefore, the positive high voltage of (n+1)·VCC at any voltage level can be produced with the circuit of simplified configuration.

Modification

Figure 27:
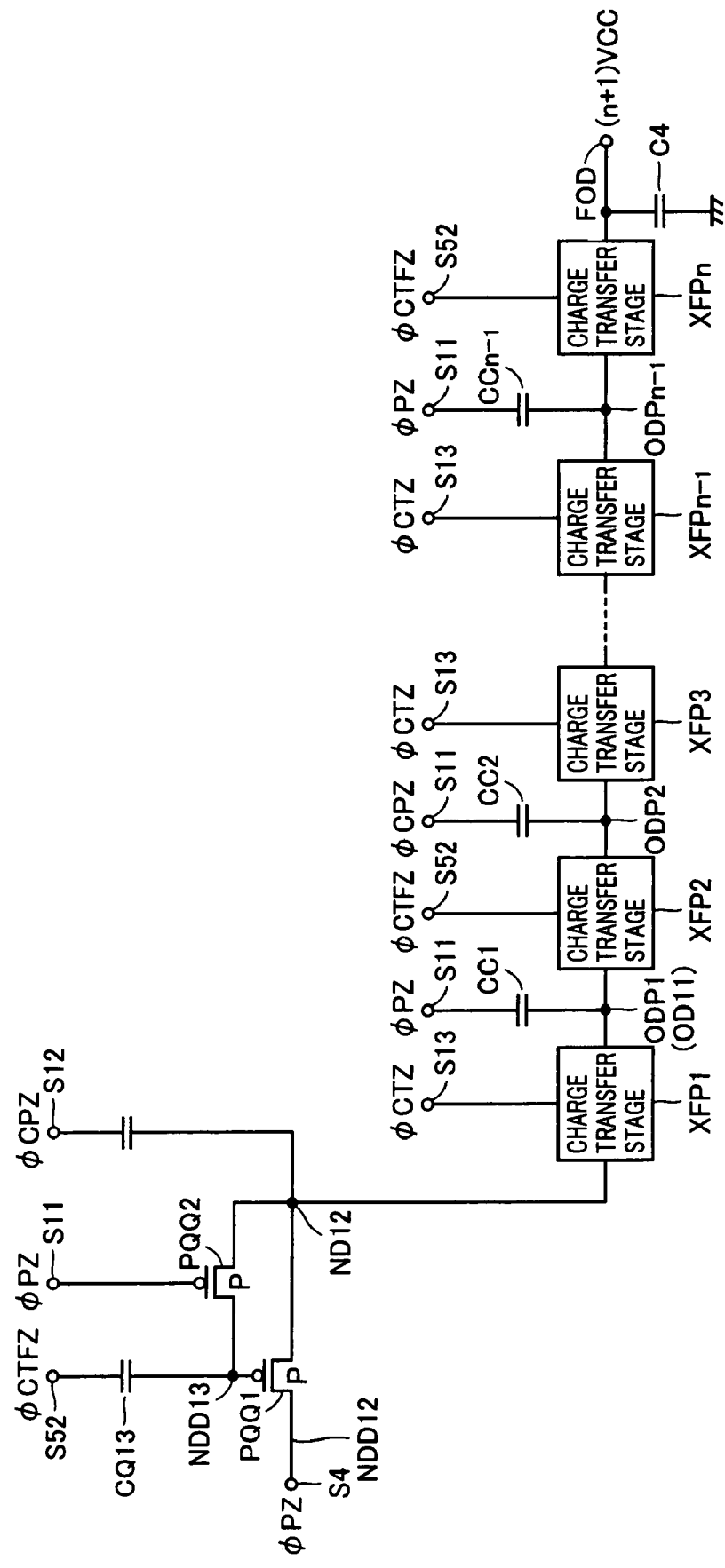
FIG. 27 shows a structure of a voltage generating circuit according to a modification of the thirteenth embodiment of the invention.

FIG. 27 shows a construction of a voltage generating circuit of a modification of the thirteenth embodiment of the invention. The voltage generating circuit shown in FIG. 27 differs in configuration from the voltage generating circuit shown in FIG. 26 in the following points. Precharge voltage supply node NDD12 is coupled to input node S11 receiving control signal ɸPZ. Other configuration of the voltage generating circuit shown in FIG. 27 is the same as that of the voltage generating circuit shown in FIG. 26. Corresponding portions are allotted with the same reference numerals, and description thereof will not be repeated.

According to the construction of the voltage generating circuit shown in FIG. 27, a voltage changing between voltages of VCC and 2·VCC is produced on internal node ND12. Similarly to the voltage generating circuit shown in FIG. 26, the high positive voltage at the level of (n+1)·VCC is generated from final output node FOD, similarly to the voltage generating circuit shown in FIG. 26.

The voltage generating circuit shown in FIG. 27 does not use power supply voltage VCC for generating the high voltage of (n+1)·VCC. Therefore, the circuit configuration can be made simple.

The operation waveforms of the voltage generating circuit shown in FIG. 27 are represented by those shown in FIG. 19, similarly to the voltage generating circuit shown in FIG. 26.

According to the thirteenth embodiment of the invention, as described above, a plurality of charge transfer stages are cascaded between the internal node and the final output node, and these charge transfer stages alternately perform the precharging of the output node and the charge transferring. In addition, all the transistor elements are formed of the P-channel MOS transistors, and the charges can be efficiently transferred to produce a positive high voltage. Further, the circuit occupation area and the manufacturing cost can be reduced.

The voltage generating circuit according to the invention can be applied to a general LSI (Large Scale Integrated Circuit) as an embedded circuit producing an internal voltage. In addition, the present invention can be generally applied to semiconductor device requiring a voltage at a level different from the power supply voltage and/or the ground voltage. Further, the voltage generating circuit according to the invention can be utilized for driving liquid crystal elements in a liquid crystal display device requiring positive and negative voltages. By utilizing the voltage generating circuit according to the invention, it is possible to reduce costs of the parts and/or a final product, and also to reduce the power consumption.

According to the invention, as described above, the gate potential of each transistor is controlled by the charge pump operation of the capacitance element to generate the charges for generating an internal voltage, and conduction/non-conduction states of the transistors are individually and accurately controlled to produce the charges for generating the internal voltage. Thus, flow of an ineffective current can be suppressed, and the charges can be efficiently used to generate an internal voltage at an intended level with reduced power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generating circuit comprising:
   a first P-type transistor directly connected between a precharge voltage supply node supplying a precharge voltage and a first internal node, and having a control electrode connected to a second internal node, said precharge voltage supply node being normally isolated from a node supplying a fixed voltage with a constant voltage level regardless of a voltage level at said precharge voltage supply node, and the precharge voltage supply node directly receiving a second control signal controlling charge accumulation, said second control signal varying between ground and the precharge voltage level so as to attain the ground and the precharge voltage level;
   a first capacitance element connected between a first input node receiving a first control signal for precharging and said second internal node;
   a second P-type transistor connected between the first and second internal nodes, and having a control electrode receiving a second control signal;
   a third P-type transistor connected between said first internal node and an output node, and having a control electrode connected to a third internal node, configured to produce a positive boosted voltage higher than said precharge voltage at said output node;
   a fourth P-type transistor connected between said output node and said third internal node, and having a control electrode connected to said first internal node;
   a second capacitance element connected between a third input node receiving a third control signal controlling second charge precharging and said first internal node; and
   a third capacitance element connected between a fourth input node receiving a fourth control signal controlling charge transfer and said third internal node.

2. The voltage generating circuit according to claim 1, wherein
   said third control signal attains and maintains for a predetermined time period a second logical level when said second control signal is at a first logical level, and said fourth control signal attains and maintains for a predetermined time period the first logical level when said third control signal is at the second logical level, and precharging of said first internal node is performed when said first control signal attains the first logical level while said second control signal is at the second logical level.

3. The voltage generating circuit according to claim 1, further comprising:

at least one voltage drive stage connected between said output node and said final output node, and generating a final positive boosted voltage on said final output node, said voltage drive stage including;

a fifth P-type transistor connected between an input node of said voltage drive stage and an output node of said voltage drive stage, and having a control electrode connected to a fourth internal node, a fourth capacitance element coupled to the input node of said voltage drive stage, a fifth capacitance coupled to said fourth internal node, and a sixth P-type transistor connected between said fourth internal node and the output node of said voltage drive stage, and having a control electrode connected to the input node of said voltage drive stage, wherein said at least voltage drive stage includes a plurality of such voltage drive stages, the second and third control signals being alternately applied to the fourth capacitance elements in a connection sequence of the voltage drive stages, and said first and fourth control signals are alternately applied to the fifth capacitance elements in the connection sequence, and said plurality of such voltage drive stages sequentially boost recieved voltages at corresponding input nodes to produce boosted voltages at corresponding output nodes.

4. The voltage generating circuit according to claim 3, wherein said first control signal attains a first logical level and is maintained thereat for a predetermined time period when a predetermined time elapses since said second control signal changes from the first logical level to a second logical level, and said second control signal changes from the second logical level to the first logical level after said first control signal changes from the first logical level to the second logical level, said third control signal attains the second logical level and is maintained thereat for a predetermined period since said second control signal changes to the first logical level, and said second control signal attains the second logical level after said third control signal changes to the first logical level, and said fourth control signal attains the first logical level and is maintained thereat for a predetermined time after said third control signal changes to the second logical level, and said third control signal changes to the first logical level after said fourth control signal changes to the second logical level.

5. The voltage generating circuit according to claim 3, wherein said final output node applies said final positive boosted voltage to internal circuitry, and said voltage generating circuit further comprises a capacitance element connected to said final output node.

6. The voltage generating circuit according to claim 1, wherein said output node generates said positive boosted voltage as an internal voltage to be applied to internal circuitry, and said voltage generating circuit further comprises a capacitance element connected to said output node.

7. The voltage generating circuit according to claim 1, wherein the output node outputs a positive voltage higher than the precharge voltage.

* * * * *